United States Patent
Costa et al.

(10) Patent No.: US 11,456,282 B2
(45) Date of Patent: Sep. 27, 2022

(54) RF DEVICES WITH ENHANCED PERFORMANCE AND METHODS OF FORMING THE SAME

(71) Applicant: Qorvo US, Inc., Greensboro, NC (US)

(72) Inventors: Julio C. Costa, Oak Ridge, NC (US); Michael Carroll, Jamestown, NC (US)

(73) Assignee: Qorvo US, Inc., Greensboro, NC (US)

( * ) Notice: Subject to any disclaimer, the term of this patent is extended or adjusted under 35 U.S.C. 154(b) by 11 days.

(21) Appl. No.: 16/678,619

(22) Filed: Nov. 8, 2019

(65) Prior Publication Data
US 2020/0235074 A1 Jul. 23, 2020

Related U.S. Application Data

(60) Provisional application No. 62/866,943, filed on Jun. 26, 2019, provisional application No. 62/795,804, filed on Jan. 23, 2019.

(51) Int. Cl.
*H01L 25/065* (2006.01)
*H01L 25/00* (2006.01)

(52) U.S. Cl.
CPC .......... *H01L 25/0657* (2013.01); *H01L 25/50* (2013.01); *H01L 2224/32225* (2013.01);
(Continued)

(58) Field of Classification Search
CPC ... H01L 25/06; H01L 25/065; H01L 25/0657; H01L 25/50; H01L 2224/32;
(Continued)

(56) References Cited

U.S. PATENT DOCUMENTS 1,093,562 A 6/1978 Kishimoto
4,366,202 A 12/1982 Borovsky
(Continued)

FOREIGN PATENT DOCUMENTS

CN 1696231 A 11/2005
CN 101901953 A 12/2010
(Continued)

OTHER PUBLICATIONS

Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
(Continued)

*Primary Examiner* — Monica D Harrison
(74) *Attorney, Agent, or Firm* — Withrow & Terranova, PLLC

(57) ABSTRACT

The present disclosure relates to a radio frequency device that includes a transfer device die and a multilayer redistribution structure underneath the transfer device die. The transfer device die includes a device region with a back-end-of-line (BEOL) portion and a front-end-of-line (FEOL) portion over the BEOL portion and a transfer substrate. The FEOL portion includes isolation sections and an active layer surrounded by the isolation sections. A top surface of the device region is planarized. The transfer substrate including a porous silicon (PSi) region resides over the top surface of the device region. Herein, the PSi region has a porosity between 1% and 80%. The multilayer redistribution structure includes a number of bump structures, which are at a bottom of the multilayer redistribution structure and electrically coupled to the FEOL portion of the transfer device die.

22 Claims, 13 Drawing Sheets

(52) U.S. Cl.
CPC ............... *H01L 2924/15311* (2013.01); *H01L 2924/181* (2013.01)

(58) Field of Classification Search
CPC ....... H01L 2224/322; H01L 2224/3222; H01L 2224/32225; H01L 2924/15; H01L 2924/153; H01L 2924/1531; H01L 2924/15311; H01L 2924/18; H01L 2924/181
USPC .......................................................... 257/686
See application file for complete search history.

(56) References Cited

U.S. PATENT DOCUMENTS

| | | | |
|---|---|---|---|
| 5,013,681 A | 5/1991 | Godbey et al. | |
| 5,061,663 A | 10/1991 | Bolt et al. | |
| 5,069,626 A | 12/1991 | Patterson et al. | |
| 5,164,687 A | 11/1992 | Kurian et al. | |
| 5,294,295 A | 3/1994 | Gabriel | |
| 5,362,972 A | 11/1994 | Yazawa et al. | |
| 5,391,257 A | 2/1995 | Sullivan et al. | |
| 5,459,368 A | 10/1995 | Onishi et al. | |
| 5,646,432 A | 7/1997 | Iwaki et al. | |
| 5,648,013 A | 7/1997 | Uchida et al. | |
| 5,699,027 A | 12/1997 | Tsuji et al. | |
| 5,709,960 A | 1/1998 | Mays et al. | |
| 5,729,075 A | 3/1998 | Strain | |
| 5,831,369 A | 11/1998 | Fürbacher et al. | |
| 5,920,142 A | 7/1999 | Onishi et al. | |
| 6,072,557 A | 6/2000 | Kishimoto | |
| 6,084,284 A | 7/2000 | Adamic, Jr. | |
| 6,154,366 A | 11/2000 | Ma et al. | |
| 6,154,372 A | 11/2000 | Kalivas et al. | |
| 6,235,554 B1 | 5/2001 | Akram et al. | |
| 6,236,061 B1 | 5/2001 | Walpita | |
| 6,268,654 B1 | 7/2001 | Glenn et al. | |
| 6,271,469 B1 | 8/2001 | Ma et al. | |
| 6,377,112 B1 | 4/2002 | Rozsypal | |
| 6,423,570 B1 | 7/2002 | Ma et al. | |
| 6,426,559 B1 | 7/2002 | Bryan et al. | |
| 6,441,498 B1 | 8/2002 | Song | |
| 6,446,316 B1 | 9/2002 | Fürbacher et al. | |
| 6,578,458 B1 | 6/2003 | Akram et al. | |
| 6,649,012 B2 | 11/2003 | Masayuki et al. | |
| 6,703,688 B1 | 3/2004 | Fitzergald | |
| 6,713,859 B1 | 3/2004 | Ma | |
| 6,841,413 B2 | 1/2005 | Liu et al. | |
| 6,864,156 B1 | 3/2005 | Conn | |
| 6,902,950 B2 | 6/2005 | Ma et al. | |
| 6,943,429 B1 | 9/2005 | Glenn et al. | |
| 6,964,889 B2 | 11/2005 | Ma et al. | |
| 6,992,400 B2 | 1/2006 | Tikka et al. | |
| 7,042,072 B1 | 5/2006 | Kim et al. | |
| 7,049,692 B2 | 5/2006 | Nishimura et al. | |
| 7,064,391 B1 | 6/2006 | Conn | |
| 7,109,635 B1 | 9/2006 | McClure et al. | |
| 7,183,172 B2 | 2/2007 | Lee et al. | |
| 7,190,064 B2 | 3/2007 | Wakabayashi et al. | |
| 7,238,560 B2 | 7/2007 | Sheppard et al. | |
| 7,279,750 B2 | 10/2007 | Jobetto | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,402,901 B2 | 7/2008 | Hatano et al. | |
| 7,427,824 B2 | 9/2008 | Iwamoto et al. | |
| 7,489,032 B2 | 2/2009 | Jobetto | |
| 7,596,849 B1 | 10/2009 | Carpenter et al. | |
| 7,619,347 B1 | 11/2009 | Bhattacharjee | |
| 7,635,636 B2 | 12/2009 | McClure et al. | |
| 7,714,535 B2 | 5/2010 | Yamazaki et al. | |
| 7,749,882 B2 | 7/2010 | Kweon et al. | |
| 7,790,543 B2 | 9/2010 | Abadeer et al. | |
| 7,816,231 B2 | 10/2010 | Dyer et al. | |
| 7,843,072 B1 | 11/2010 | Park et al. | |
| 7,855,101 B2 | 12/2010 | Furman et al. | |
| 7,868,419 B1 | 1/2011 | Kerr et al. | |
| 7,910,405 B2 | 3/2011 | Okada et al. | |
| 7,955,955 B2 | 6/2011 | Lane et al. | |
| 7,960,218 B2 | 6/2011 | Ma et al. | |
| 8,004,089 B2 | 8/2011 | Jobetto | |
| 8,183,151 B2 | 5/2012 | Lake | |
| 8,299,633 B2 | 10/2012 | Su | |
| 8,420,447 B2 | 4/2013 | Tay et al. | |
| 8,503,186 B2 | 8/2013 | Lin et al. | |
| 8,563,403 B1 | 10/2013 | Farooq et al. | |
| 8,643,148 B2 | 2/2014 | Lin et al. | |
| 8,658,475 B1 | 2/2014 | Kerr | |
| 8,664,044 B2 | 3/2014 | Jin et al. | |
| 8,772,853 B2 | 7/2014 | Hong et al. | |
| 8,791,532 B2 | 7/2014 | Graf et al. | |
| 8,802,495 B2 | 8/2014 | Kim et al. | |
| 8,803,242 B2 | 8/2014 | Marino et al. | |
| 8,816,407 B2 | 8/2014 | Kim et al. | |
| 8,835,978 B2 | 9/2014 | Mauder et al. | |
| 8,906,755 B1 | 12/2014 | Hekmatshoartabari et al. | |
| 8,921,990 B2 | 12/2014 | Park et al. | |
| 8,927,968 B2 | 1/2015 | Cohen et al. | |
| 8,941,248 B2 | 1/2015 | Lin et al. | |
| 8,963,321 B2 | 2/2015 | Lenniger et al. | |
| 8,983,399 B2 | 3/2015 | Kawamura et al. | |
| 9,064,883 B2 | 6/2015 | Meyer et al. | |
| 9,165,793 B1 | 10/2015 | Wang et al. | |
| 9,214,337 B2 | 12/2015 | Carroll et al. | |
| 9,349,700 B2 | 5/2016 | Hsieh et al. | |
| 9,368,429 B2 | 6/2016 | Ma et al. | |
| 9,406,637 B2 | 8/2016 | Wakisaka et al. | |
| 9,461,001 B1 | 10/2016 | Tsai et al. | |
| 9,520,428 B2 | 12/2016 | Fujimori | |
| 9,530,709 B2 | 12/2016 | Leipold et al. | |
| 9,613,831 B2 | 4/2017 | Morris et al. | |
| 9,646,856 B2 | 5/2017 | Meyer et al. | |
| 9,653,428 B1 | 5/2017 | Hiner et al. | |
| 9,786,586 B1 | 10/2017 | Shih | |
| 9,812,350 B2 | 11/2017 | Costa | |
| 9,824,951 B2 | 11/2017 | Leipold et al. | |
| 9,824,974 B2 | 11/2017 | Gao et al. | |
| 9,859,254 B1 | 1/2018 | Yu et al. | |
| 9,875,971 B2 | 1/2018 | Bhushan et al. | |
| 9,941,245 B2 | 4/2018 | Skeete et al. | |
| 10,134,837 B1 | 11/2018 | Fanelli et al. | |
| 10,727,212 B2 | 7/2020 | Moon et al. | |
| 10,784,348 B2 * | 9/2020 | Fanelli | H01L 21/0203 |
| 10,882,740 B2 | 1/2021 | Costa et al. | |
| 2001/0004131 A1 | 6/2001 | Masayuki et al. | |
| 2002/0070443 A1 | 6/2002 | Mu et al. | |
| 2002/0074641 A1 | 6/2002 | Towle et al. | |
| 2002/0127769 A1 | 9/2002 | Ma et al. | |
| 2002/0127780 A1 | 9/2002 | Ma et al. | |
| 2002/0137263 A1 | 9/2002 | Towle et al. | |
| 2002/0185675 A1 | 12/2002 | Furukawa | |
| 2003/0207515 A1 | 11/2003 | Tan et al. | |
| 2004/0021152 A1 | 2/2004 | Nguyen et al. | |
| 2004/0164367 A1 | 8/2004 | Park | |
| 2004/0166642 A1 | 8/2004 | Chen et al. | |
| 2004/0219765 A1 | 11/2004 | Reif et al. | |
| 2005/0037595 A1 | 2/2005 | Nakahata | |
| 2005/0077511 A1 | 4/2005 | Fitzgerald | |
| 2005/0079686 A1 | 4/2005 | Aigner et al. | |
| 2005/0212419 A1 | 9/2005 | Vazan et al. | |
| 2005/0258447 A1 | 11/2005 | Oi et al. | |
| 2006/0057782 A1 | 3/2006 | Gardes et al. | |
| 2006/0099781 A1 | 5/2006 | Beaumont et al. | |
| 2006/0105496 A1 | 5/2006 | Chen et al. | |
| 2006/0108585 A1 | 5/2006 | Gan et al. | |
| 2006/0228074 A1 | 10/2006 | Lipson et al. | |
| 2006/0261446 A1 | 11/2006 | Wood et al. | |
| 2007/0020807 A1 | 1/2007 | Geefay et al. | |
| 2007/0045738 A1 | 3/2007 | Jones et al. | |
| 2007/0069393 A1 | 3/2007 | Asahi et al. | |
| 2007/0075317 A1 | 4/2007 | Kato et al. | |
| 2007/0121326 A1 | 5/2007 | Nall et al. | |
| 2007/0158746 A1 | 7/2007 | Ohguro | |
| 2007/0181992 A1 | 8/2007 | Lake | |

(56) References Cited

U.S. PATENT DOCUMENTS

| | | |
|---|---|---|
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0020513 A1 | 1/2008 | Jobetto |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0251927 A1 | 10/2008 | Zhao et al. |
| 2008/0265978 A1 | 10/2008 | Englekirk |
| 2008/0272497 A1 | 11/2008 | Lake |
| 2008/0277800 A1 | 11/2008 | Hwang et al. |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0230542 A1 | 9/2009 | Lin et al. |
| 2009/0243097 A1 | 10/2009 | Koroku et al. |
| 2009/0261460 A1 | 10/2009 | Kuan et al. |
| 2009/0302484 A1 | 12/2009 | Lee et al. |
| 2010/0003803 A1 | 1/2010 | Oka et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0227158 A1 | 9/2011 | Zhu |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0221493 A1 | 8/2013 | Kim et al. |
| 2013/0241040 A1 | 9/2013 | Tojo et al. |
| 2013/0280826 A1 | 10/2013 | Scanlan et al. |
| 2013/0299871 A1 | 11/2013 | Mauder et al. |
| 2014/0015131 A1 | 1/2014 | Meyer et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0323064 A1 | 10/2014 | McCarthy |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0021754 A1 | 1/2015 | Lin et al. |
| 2015/0097302 A1 | 4/2015 | Wakisaka et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0056544 A1 | 2/2016 | Garcia et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0024503 A1 | 1/2017 | Connelly |
| 2017/0032957 A1 | 2/2017 | Costa et al. |
| 2017/0033026 A1 | 2/2017 | Ho et al. |
| 2017/0053938 A1 | 2/2017 | Whitefield |
| 2017/0062366 A1 | 3/2017 | Enquist |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0200648 A1 | 7/2017 | Lee et al. |
| 2017/0207350 A1 | 7/2017 | Leipold et al. |
| 2017/0263539 A1 | 9/2017 | Gowda et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0076174 A1 | 3/2018 | Costa et al. |
| 2018/0138082 A1 | 5/2018 | Costa et al. |
| 2018/0138227 A1 | 5/2018 | Shimotsusa et al. |
| 2018/0145678 A1 | 5/2018 | Maxim et al. |
| 2018/0166358 A1 | 6/2018 | Costa et al. |
| 2018/0261470 A1 | 9/2018 | Costa et al. |
| 2018/0269188 A1 | 9/2018 | Yu et al. |
| 2018/0342439 A1 | 11/2018 | Costa et al. |
| 2019/0013254 A1 | 1/2019 | Costa et al. |
| 2019/0013255 A1 | 1/2019 | Costa et al. |
| 2019/0043812 A1 | 2/2019 | Leobandung |
| 2019/0057922 A1 | 2/2019 | Costa et al. |
| 2019/0074263 A1 | 3/2019 | Costa et al. |

(56) References Cited

U.S. PATENT DOCUMENTS

| | | |
|---|---|---|
| 2019/0074271 A1 | 3/2019 | Costa et al. |
| 2019/0172826 A1 | 6/2019 | Or-Bach et al. |
| 2019/0172842 A1 | 6/2019 | Whitefield |
| 2019/0189599 A1 | 6/2019 | Baloglu et al. |
| 2019/0229101 A1 | 7/2019 | Lee |
| 2019/0287953 A1 | 9/2019 | Moon et al. |
| 2019/0304910 A1 | 10/2019 | Fillion |
| 2019/0304977 A1 | 10/2019 | Costa et al. |
| 2019/0312110 A1 | 10/2019 | Costa et al. |
| 2019/0326159 A1 | 10/2019 | Costa et al. |
| 2019/0378819 A1 | 12/2019 | Costa et al. |
| 2019/0378821 A1 | 12/2019 | Costa et al. |
| 2020/0006193 A1 | 1/2020 | Costa et al. |
| 2020/0058541 A1 | 2/2020 | Konishi et al. |
| 2020/0115220 A1 | 4/2020 | Hammond et al. |
| 2020/0118838 A1 | 4/2020 | Hammond et al. |
| 2020/0235059 A1 | 7/2020 | Cok et al. |
| 2021/0348078 A1 | 11/2021 | Haramoto et al. |

FOREIGN PATENT DOCUMENTS

| | | |
|---|---|---|
| CN | 102956468 A | 3/2013 |
| CN | 103811474 A | 5/2014 |
| CN | 103872012 A | 6/2014 |
| CN | 106098609 A | 11/2016 |
| EP | 1098386 A1 | 5/2001 |
| EP | 2996143 A1 | 3/2016 |
| JP | S505733 Y1 | 2/1975 |
| JP | S5338954 A | 4/1987 |
| JP | H11-220077 A | 8/1999 |
| JP | 2002093957 A | 3/2002 |
| JP | 2002252376 A | 9/2002 |
| JP | 2004273604 A | 9/2004 |
| JP | 2004327557 A | 11/2004 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| JP | 2009200274 A | 9/2009 |
| JP | 2009302526 A | 12/2009 |
| JP | 2011216780 A | 10/2011 |
| JP | 2011243596 A | 12/2011 |
| JP | 2012129419 A | 7/2012 |
| JP | 2012156251 A | 8/2012 |
| JP | 2013162096 A | 8/2013 |
| JP | 2013222745 A | 10/2013 |
| JP | 2013254918 A | 12/2013 |
| JP | 2014509448 A | 4/2014 |
| TW | 201733056 A | 9/2017 |
| WO | 2007074651 A1 | 7/2007 |
| WO | 2018083961 A1 | 5/2018 |
| WO | 2018125242 A1 | 7/2018 |

OTHER PUBLICATIONS

Zeng, X. et al., "A Combination of Boron Nitride Nanotubes and Cellulose Nanofibers for the Preparation of A Nanocomposite with High Thermal Conductivity," ACS Nano, vol. 11, No. 5, 2017, American Chemical Society, pp. 5167-5178.
Quayle Action for U.S. Appl. No. 16/703,251, filed Jun. 26, 2020, 5 pages.
Notice of Allowance for U.S. Appl. No. 15/873,152, dated May 11, 2020, 8 pages.
Corrected Notice of Allowability for U.S. Appl. No. 15/695,579, dated May 20, 2020, 4 pages.
Notice of Allowability for U.S. Appl. No. 15/695,579, dated Jun. 25, 2020, 4 pages.
Notice of Allowance for U.S. Appl. No. 16/004,961, dated Apr. 30, 2020, 8 pages.
Notice of Allowance for U.S. Appl. No. 16/368,210, dated Jun. 17, 2020, 10 pages.
Non-Final Office Action for U.S. Appl. No. 16/374,125, dated Jun. 26, 2020, 12 pages.
Non-Final Office Action for U.S. Appl. No. 16/390,496, dated Jul. 10, 2020, 17 pages.
Non-Final Office Action for U.S. Appl. No. 16/204,214, dated May 19, 2020, 15 pages.
Non-Final Office Action for U.S. Appl. No. 16/454,687, dated May 15, 2020, 14 pages.
Non-Final Office Action for U.S. Appl. No. 16/454,809, dated May 15, 2020, 12 pages.
Examination Report for European Patent Application No. 16751791.1, dated Apr. 30, 2020, 15 pages.
Notification of Reasons for Refusal for Japanese Patent Application No. 2018-526613, dated May 11, 2020, 6 pages.
Examination Report for Singapore Patent Application No. 11201901193U, dated May 26, 2020, 6 pages.
International Search Report and Written Opinion for International Patent Application No. PCT/US2020/014662, dated May 7, 2020, 18 pages.
International Search Report and Written Opinion for International Patent Application No. PCT/US2020/014665, dated May 13, 2020, 17 pages.
International Search Report and Written Opinion for International Patent Application No. PCT/US2020/014666, dated Jun. 4, 2020, 18 pages.
International Search Report and Written Opinion for International Patent Application No. PCT/US2020/014667, dated May 18, 2020, 14 pages.
International Search Report and Written Opinion for International Patent Application No. PCT/US2020/014669, dated Jun. 4, 2020, 15 pages.
Non-Final Office Action for U.S. Appl. No. 16/527,702, dated Jan. 10, 2020, 10 pages.
Office Action for Japanese Patent Application No. 2018-526613, dated Nov. 5, 2019, 8 pages.
Intention to Grant for European Patent Application No. 17757646.9, dated Feb. 27, 2020, 55 pages.
International Search Report and Written Opinion for International Patent Application No. PCT/US2019/034645, dated Sep. 19, 2019, 14 pages.
International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
International Search Report and Written Opinion for International Patent Application No. PCT/US2019/034699, dated Oct. 29, 2019, 13 pages.
Corrected Notice of Allowability for U.S. Appl. No. 15/695,579, dated Apr. 1, 2020, 4 pages.
Final Office Action for U.S. Appl. No. 16/204,214, dated Mar. 6, 2020, 14 pages.
Notice of Allowance for U.S. Appl. No. 15/816,637, dated Apr. 2, 2020, 8 pages.
Notice of Allowance for U.S. Appl. No. 16/527,702, dated Apr. 9, 2020, 8 pages.
Decision of Rejection for Japanese Patent Application No. 2015-180657, dated Mar. 17, 2020, 4 pages.
Advisory Action for U.S. Appl. No. 16/204,214, dated Apr. 15, 2020, 3 pages.
Dhar, S. et al., "Electron Mobility Model for Strained-Si Devices," IEEE Transactions on Electron Devices, vol. 52, No. 4, Apr. 2005, IEEE, pp. 527-533.
Notice of Allowance for U.S. Appl. No. 16/038,879, dated Apr. 15, 2020, 9 pages.
Notice of Allowance for U.S. Appl. No. 16/527,702, dated Nov. 13, 2020, 8 pages.
Notice of Allowance for U.S. Appl. No. 16/374,125, dated Dec. 16, 2020, 9 pages.

(56) References Cited

OTHER PUBLICATIONS

Final Office Action for U.S. Appl. No. 16/390,496, dated Dec. 24, 2020, 21 pages.
Non-Final Office Action for U.S. Appl. No. 16/426,527, dated Nov. 20, 2020, 7 pages.
Final Office Action for U.S. Appl. No. 16/204,214, dated Nov. 30, 2020, 15 pages.
Notice of Allowance for U.S. Appl. No. 16/454,809, dated Nov. 25, 2020, 8 pages.
Non-Final Office Action for U.S. Appl. No. 16/427,019, dated Nov. 19, 2020, 19 pages.
First Office Action for Chinese Patent Application No. 201680058198.6, dated Dec. 29, 2020, 14 pages.
International Preliminary Report on Patentability for International Patent Application No. PCT/US2019/034645, dated Jan. 14, 2021, 9 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Advisory Action for U.S. Appl. No. 16/390,496, dated Mar. 1, 2021, 3 pages.
Notice of Allowance for U.S. Appl. No. 16/390,496, dated Apr. 5, 2021, 7 pages.
Notice of Allowance for U.S. Appl. No. 16/204,214, dated Feb. 17, 2021, 11 pages.
Non-Final Office Action for U.S. Appl. No. 16/678,551, dated Apr. 7, 2021, 9 pages.
Non-Final Office Action for U .S. U.S. Appl. No. 16/678,573, dated Feb. 19, 2021, 11 pages.
Non-Final Office Action for U.S. Appl. No. 16/678,602, dated Feb. 19, 2021, 10 pages.
Supplementary Examination Report for Singapore Patent Application No. 11201901194S, dated Mar. 10, 2021, 3 pages.
International Preliminary Report on Patentability for International Patent Application No. PCT/US2019/055317, dated Apr. 22, 2021, 11 pages.

(56) References Cited

OTHER PUBLICATIONS

International Preliminary Report on Patentability for International Patent Application No. PCT/US2019/055321, dated Apr. 22, 2021, 14 pages.
Office Action for Taiwanese Patent Application No. 108140788, dated Mar. 25, 2021, 18 pages.
Applicant-Initiated Interview Summary for U.S. Appl. No. 16/678,573, dated May 7, 2021, 2 pages.
Notice of Allowance for U.S. Appl. No. 16/703,251, dated Aug. 27, 2020, 8 pages.
Notice of Allowance for U.S. Appl. No. 16/454,687, dated Aug. 14, 2020, 7 pages.
Final Office Action for U.S. Appl. No. 16/454,809, dated Aug. 21, 2020, 12 pages.
Advisory Action for U.S. Appl. No. 16/454,809, dated Oct. 23, 2020, 3 pages.
Decision to Grant for Japanese Patent Application No. 2018-526613, dated Aug. 17, 2020, 5 pages.
International Preliminary Report on Patentability for International Patent Application No. PCT/US2019/025591, dated Oct. 15, 2020, 6 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a97390769.18c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.

(56) References Cited

OTHER PUBLICATIONS

Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.

Costa, J. et al., "Integrated MEMS Switch Technology On SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelecuonics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III—V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.

(56) References Cited

OTHER PUBLICATIONS

Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Non-Final Office Action for U.S. Appl. No. 15/676,693, dated May 3, 2018, 14 pages.
Notice of Allowance for U.S. Appl. No. 15/789,107, dated May 18, 2018, 8 pages.
Final Office Action for U.S. Appl. No. 15/616,109, dated Apr. 19, 2018, 18 pages.
Notice of Allowance for U.S. Appl. No. 15/676,693, dated Jul. 20, 2018, 8 pages.
Notice of Allowance for U.S. Appl. No. 15/695,629, dated Jul. 11, 2018, 12 pages.
Notice of Allowance for U.S. Appl. No. 15/387,855, dated Aug. 10, 2018, 7 pages.
Notice of Allowance for U.S. Appl. No. 15/914,538, dated Aug. 1, 2018, 9 pages.
Notice of Allowance and Applicant-Initiated Interview Summary for U.S. Appl. No. 15/262,457, dated Sep. 28, 2018, 16 pages.
Corrected Notice of Allowance for U.S. Appl. No. 15/676,693, dated Aug. 29, 2018, 5 pages.
Final Office Action for U.S. Appl. No. 15/601,858, dated Nov. 26, 2018, 16 pages.
Non-Final Office Action for U.S. Appl. No. 15/945,418, dated Nov. 1, 2018, 13 pages.
First Office Action for Chinese Patent Application No. 201510746323.X, dated Nov. 2, 2018, 12 pages.
Advisory Action for U.S. Appl. No. 15/601,858, dated Jan. 22, 2019, 3 pages.
Notice of Allowance for U.S. Appl. No. 16/038,879, dated Jan. 9, 2019, 8 pages.
Notice of Allowance for U.S. Appl. No. 16/004,961, dated Jan. 11, 2019, 8 pages.
International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Non-Final Office Action for U.S. Appl. No. 15/992,613, dated Feb. 27, 2019, 15 pages.
Non-Final Office Action for U.S. Appl. No. 15/695,579, dated Jan. 28, 2019, 8 pages.
Notice of Allowance for U.S. Appl. No. 15/992,639, dated May 9, 2019, 7 pages.
Notice of Allowance for U.S. Appl. No. 15/695,579, dated Mar. 20, 2019, 8 pages.
Notice of Allowance for U.S. Appl. No. 16/004,961, dated May 13, 2019, 8 pages.
Non-Final Office Action for U.S. Appl. No. 15/601,858, dated Apr. 17, 2019, 9 pages.
Tsai, Chun-Lin, et al., "Smart GaN platform; Performance & Challenges," IEEE International Electron Devices Meeting, 2017, 4 pages.
Tsai, Szu-Ping., et al., "Performance Enhancement of Flip-Chip Packaged AlGaAN/GaN HEMTs by Strain Engineering Design," IEEE Transcations on Electron Devices, vol. 63, Issue 10, Oct. 2016, pp. 3876-3881.
Final Office Action for U.S. Appl. No. 15/992,613, dated May 24, 2019, 11 pages.
Non-Final Office Action for U.S. Appl. No. 15/873,152, dated May 24, 2019, 11 pages.
Notice of Allowance for U.S. Appl. No. 16/168,327, dated Jun. 28, 2019, 7 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.
International Search Report and Written Opinion for International Patent Application No. PCT/US19/25591, dated Jun. 21, 2019, 7 pages.
Notice of Reasons for Refusal for Japanese Patent Application No. 2015-180657, dated Jul. 9, 2019, 4 pages.
Notice of Allowance for U.S. Appl. No. 15/601,858, dated Aug. 16, 2019, 8 pages.
Advisory Action for U.S. Appl. No. 15/992,613, dated Jul. 29, 2019, 3 pages.
Final Office Action for U.S. Appl. No. 15/873,152, dated Aug. 8, 2019, 13 pages.
Notice of Allowance for U.S. Appl. No. 15/975,230, dated Jul. 22, 2019, 7 pages.
Notice of Allowance for U.S. Appl. No. 16/004,961, dated Aug. 28, 2019, 8 pages.
Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648.
Fiorenza, et al., "Systematic study of thick strained silicon NMOSFETs for digital applications," International SiGE Technology and Device Meeting, May 2006, IEEE, 2 pages.
Huang, et al., "Carrier Mobility Enhancement in Strained Si-On-Insulator Fabricated by Wafer Bonding," Symposium on VLSI Technology, Digest of Technical Papers, 2001, pp. 57-58.
Nan, et al., "Effect of Germanium content on mobility enhancement for strained silicon FET," Student Conference on Research and Development, Dec. 2017, IEEE, pp. 154-157.
Sugii, Nobuyuki, et al., "Performance Enhancement of Strained-Si MOSFETs Fabricated on a Chemical-Mechanical-Polished SiGE Substrate," IEEE Transactions on Electron Devices, vol. 49, Issue 12, Dec. 2002, pp. 2237-2243.
Yin, Haizhou, et al., "Fully-depleted Strained-Si on Insulator NMOSFETs without Relaxed SiGe Buffers," International Electron Devices Meeting, Dec. 2003, San Francisco, California, IEEE, 4 pages.
Corrected Notice of Allowability for U.S. Appl. No. 15/695,579, dated Feb. 5, 2020, 5 pages.
Notice of Allowance for U.S. Appl. No. 15/992,613, dated Sep. 23, 2019, 7 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Notice of Allowance for U.S. Appl. No. 15/873,152, dated Dec. 10, 2019, 9 pages.
Notice of Allowance for U.S. Appl. No. 16/426,527, dated May 14, 2021, 9 pages.
Final Office Action for U.S. Appl. No. 16/427,019, dated May 21, 2021, 16 pages.
Advisory Action for U.S. Appl. No. 16/427,019, dated Aug. 2, 2021, 3 pages.
Final Office Action and Examiner-Initiated Interview Summary for U.S. Appl. No. 16/678,551, dated Jun. 28, 2021, 9 pages.
Final Office Action and Examiner-Initiated Interview Summary for U.S. Appl. No. 16/678,573, dated Jun. 28, 2021, 10 pages.
Final Office Action for U.S. Appl. No. 16/678,602, dated Jun. 1, 2021, 9 pages.
Notice of Reasons for Refusal for Japanese Patent Application No. 2020119130, dated Jun. 29, 2021, 4 pages.
Notice of Reasons for Rejection for Japanese Patent Application No. 2019507765, dated Jun. 28, 2021, 4 pages.
Search Report for Japanese Patent Application No. 2019507768, dated Jul. 15, 2021, 42 pages.
Notice of Reasons for Refusal for Japanese Patent Application No. 2019507768, dated Jul. 26, 2021, 4 pages.
Reasons for Rejection for Japanese Patent Application No. 2019507767, dated Jun. 25, 2021, 5 pages.

(56) References Cited

OTHER PUBLICATIONS

International Preliminary Report on Patentability for International Patent Application No. PCT/US2019/063460, dated Jun. 10, 2021, 9 pages.
International Preliminary Report on Patentability for International Patent Application No. PCT/US2019/034699, dated Aug. 5, 2021, 9 pages.
International Preliminary Report on Patentability for International Patent Application No. PCT/US2020/014662, dated Aug. 5, 2021, 11 pages.
International Preliminary Report on Patentability for International Patent Application No. PCT/US2020/014665, dated Aug. 5, 2021, 10 pages.
International Preliminary Report on Patentability for International Patent Application No. PCT/US2020/014666, dated Aug. 5, 2021, 11 pages.
International Preliminary Report on Patentability for International Patent Application No. PCT/US2020/014667, dated Aug. 5, 2021, 8 pages.
International Preliminary Report on Patentability for International Patent Application No. PCT/US2020/014669, dated Aug. 5, 2021, 9 pages.
Corrected Notice of Allowability for U.S. Appl. No. 16/426,527, dated Aug. 18, 2021, 4 pages.
Advisory Action and Examiner-Initiated Interview Summary for U.S. Appl. No. 16/678,551, dated Sep. 13, 2021, 3 pages.
Advisory Action and Examiner-Initiated Interview Summary for U.S. Appl. No. 16/678,573, dated Sep. 10, 2021, 3 pages.
Non-Final Office Action for U.S. Appl. No. 16/678,586, dated Aug. 12, 2021, 16 pages.
Notice of Allowance and Examiner-Initiated Interview Summary for U.S. Appl. No. 16/678,602, dated Aug. 12, 2021, 11 pages.
Corrected Notice of Allowability for U.S. Appl. No. 16/678,602, dated Aug. 26, 2021, 4 pages.
Decision to Grant for Japanese Patent Application No. 2020119130, dated Sep. 7, 2021, 4 pages.
Notice of Allowance and Examiner-Initiated Interview Summary for U.S. Appl. No. 16/678,551, dated Oct. 21, 2021, 8 pages.
Notice of Allowance and Examiner-Initiated Interview Summary for U.S. Appl. No. 16/678,573, dated Oct. 21, 2021, 7 pages.
Second Office Action for Chinese Patent Application No. 201680058198.6, dated Sep. 8, 2021, 8 pages.
Non-Final Office Action for U.S. Appl. No. 16/427,019, dated Dec. 2, 2021, 17 pages.
Corrected Notice of Allowability for U.S. Appl. No. 16/678,551, dated Nov. 24, 2021, 3 pages.
Corrected Notice of Allowability for U.S. Appl. No. 16/678,573, dated Nov. 24, 2021, 3 pages.
Final Office Action for U.S. Appl. No. 16/678,586, dated Nov. 2, 2021, 15 pages.
Corrected Notice of Allowability for U.S. Appl. No. 16/678,602, dated Nov. 24, 2021, 4 pages.
Corrected Notice of Allowability for U.S. Appl. No. 16/678,602, dated Dec. 30, 2021, 4 pages.
Borel, S. et al., "Control of Selectivity between SiGE and Si in Isotropic Etching Processes," Japanese Journal of Applied Physics, vol, 43, No. 6B, 2004, pp. 3964-3966.
Examination Report for European Patent Application No. 17755402.9, dated Dec. 20, 2021, 12 pages.
Examination Report for European Patent Application No. 17755403.7, dated Dec. 20, 2021, 13 pages.
International Search Report and Written Opinion for International Patent Application No. PCT/US2021/043968, dated Nov. 19, 2021, 15 pages.
Corrected Notice of Allowability for U.S. Appl. No. 16/678,551, dated Jan. 27, 2022, 3 pages.
Corrected Notice of Allowability for U.S. Appl. No. 16/678,573, dated Jan. 27, 2022, 3 pages.
Advisory Action for U.S. Appl. No. 16/678,586, dated Jan. 26, 2022, 3 pages.
Decision of Rejection for Chinese Patent Application No. 2016380058198.6, dated Nov. 12, 2021, 6 pages.
Notice of Allowance for Japanese Patent Application No. 2019507767, dated Jan. 19, 2021, 6 pages.
Office Letter for Taiwanese Patent Application No. 108140788, dated Jan. 5, 2021, 16 pages.
Non-Final Office Action for U.S. Appl. No. 16/426,527 dated Feb. 16, 2022, 9 pages.
Non-Final Office Action for U.S. Appl. No. 16/678,586, dated Mar. 3, 2022, 14 pages.
Corrected Notice of Allowability for U.S. Appl. No. 16/678,602, dated Feb. 2, 2022, 4 pages.
Corrected Notice of Allowability for U.S. Appl. No. 16/678,602, dated Mar. 9, 2022, 4 pages.
Non-Final Office Action for U.S. Appl. No. 17/102,957, dated Feb. 17, 2022, 9 pages.
Summons to Attend for European Patent Application No. 16751791.1, dated Feb. 28, 2022, 10 pages.
Decision to Grant for Japanese Patent Application No. 2019507765, dated Feb. 10, 2022, 6 pages.
Decision to Grant for Japanese Patent Application No. 2019507768, dated Feb. 10, 2022, 6 pages.
Final Office Action for U.S. Appl. No. 16/427,019, dated Apr. 12, 2022, 15 pages.
Corrected Notice of Allowability for U.S. Appl. No. 16/678,573, dated Mar. 31, 2022, 3 pages.
Non-Final Office Action for U.S. Appl. No. 16/844,406, dated Mar. 14, 2022, 16 pages.
International Search Report and Written Opinion for International Patent Application No. PCT/US2021/062509, dated Mar. 29, 2022, 20 pages.
Corrected Notice of Allowability for U.S. Appl. No. 16/678,551, dated Mar. 9, 2022, 3 pages.
Corrected Notice of Allowability for U.S. Appl. No. 16/678,551, dated May 13, 2022, 3 pages.
Corrected Notice of Allowability for U.S. Appl. No. 16/678,573, dated May 6, 2022, 3 pages.
Corrected Notice of Allowability for U.S. Appl. No. 16/678,602, dated Apr. 8, 2022, 4 pages.
Corrected Notice of Allowability for U.S. Appl. No. 16/678,602, dated May 13, 2022, 4 pages.
Notice of Allowance for U.S. Appl. No. 17/109,935, dated Apr. 20, 2022, 15 pages.
International Search Report and Written Opinion for International Patent Application No. PCT/US2021/063093, dated May 4, 2022, 15 pages.
Invitation to Pay Additional Fees and Partial International Search for International Patent Application No. PCT/US2021/063094, dated Apr. 19, 2022, 15 pages.
Quayle Action for U.S. Appl. No. 16/426,527, dated May 26, 2022, 5 pages.
Advisory Action for U.S. Appl. No. 16/427,019, dated Jun. 2, 2022, 3 pages.
Corrected Notice of Allowability for U.S. Appl. No. 16/678,551, dated Apr. 11, 2022, 3 pages.
Corrected Notice of Allowability for U.S. Appl. No. 16/678,551, dated Jun. 15, 2022, 3 pages.
Corrected Notice of Allowability for U.S. Appl. No. 16/678,573, dated Jun. 10, 2022, 3 pages.
Corrected Notice of Allowability for U.S. Appl. No. 16/678,602, dated Jun. 10, 2022, 4 pages.
Final Office Action for U.S. Appl. No. 16/844,406, dated Jun. 24, 2022, 17 pages.
Non-Final Office Action for U.S. Appl. No. 16/427,019, dated Aug. 15, 2022, 17 pages.

* cited by examiner

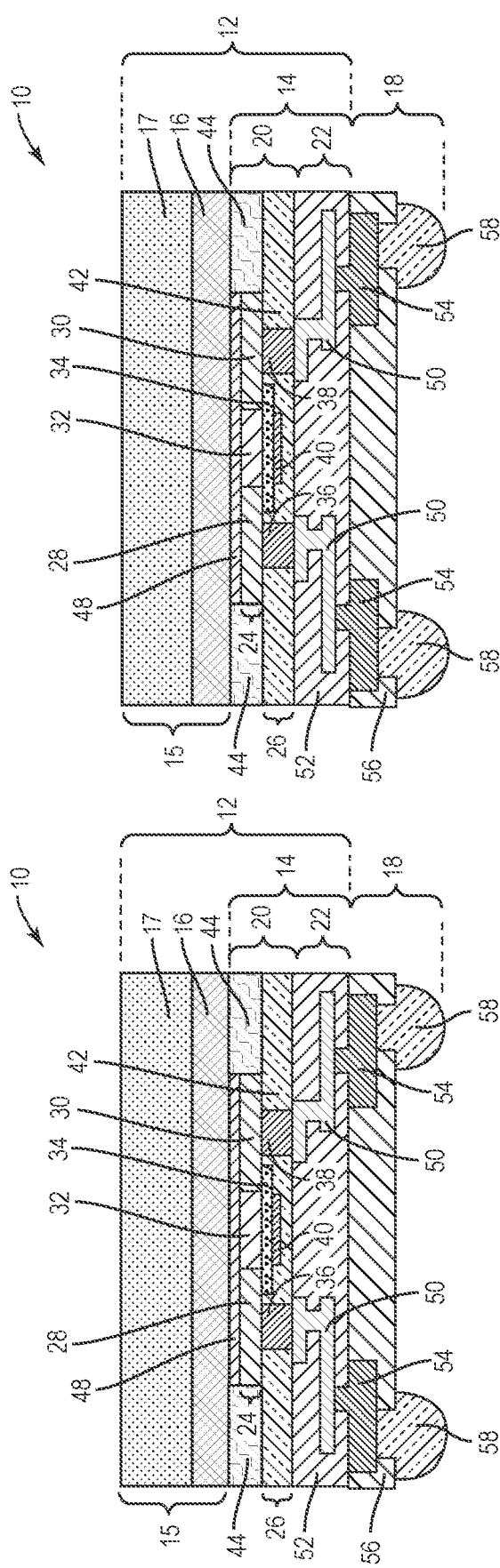
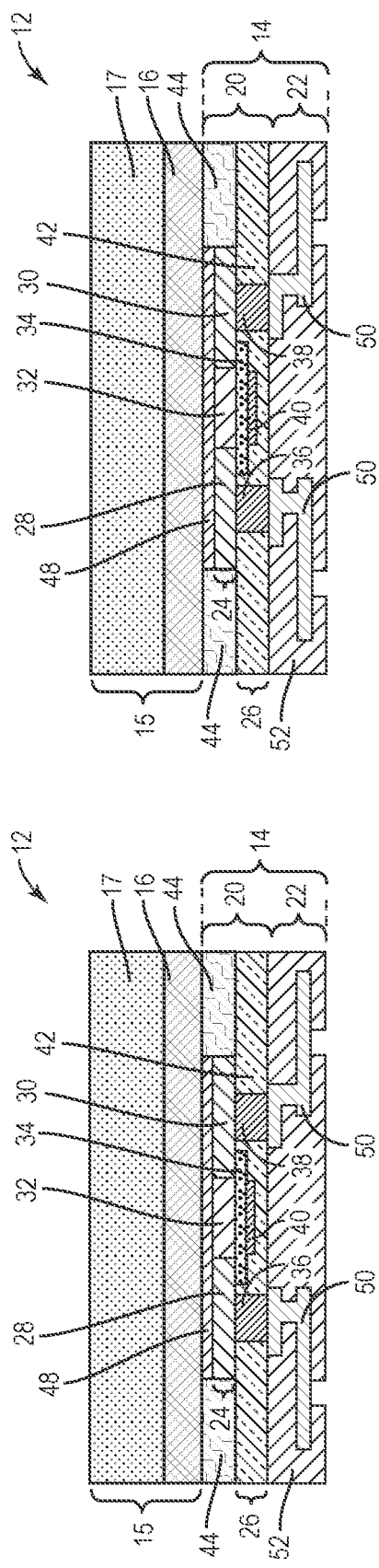
FIG. 16
FIG. 17

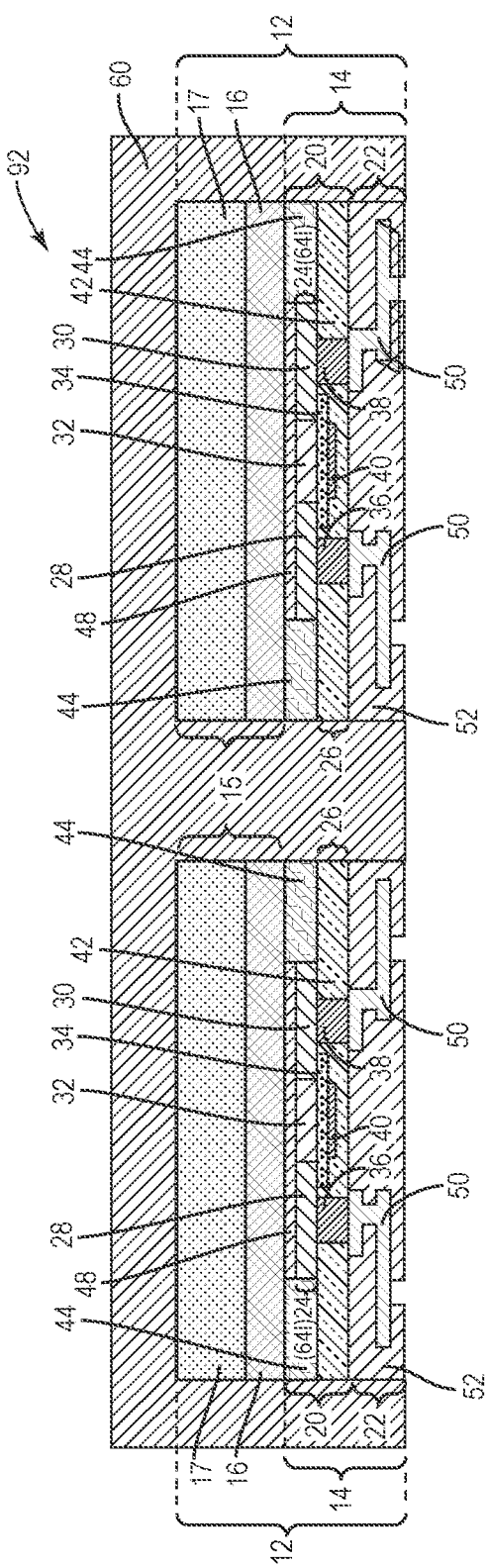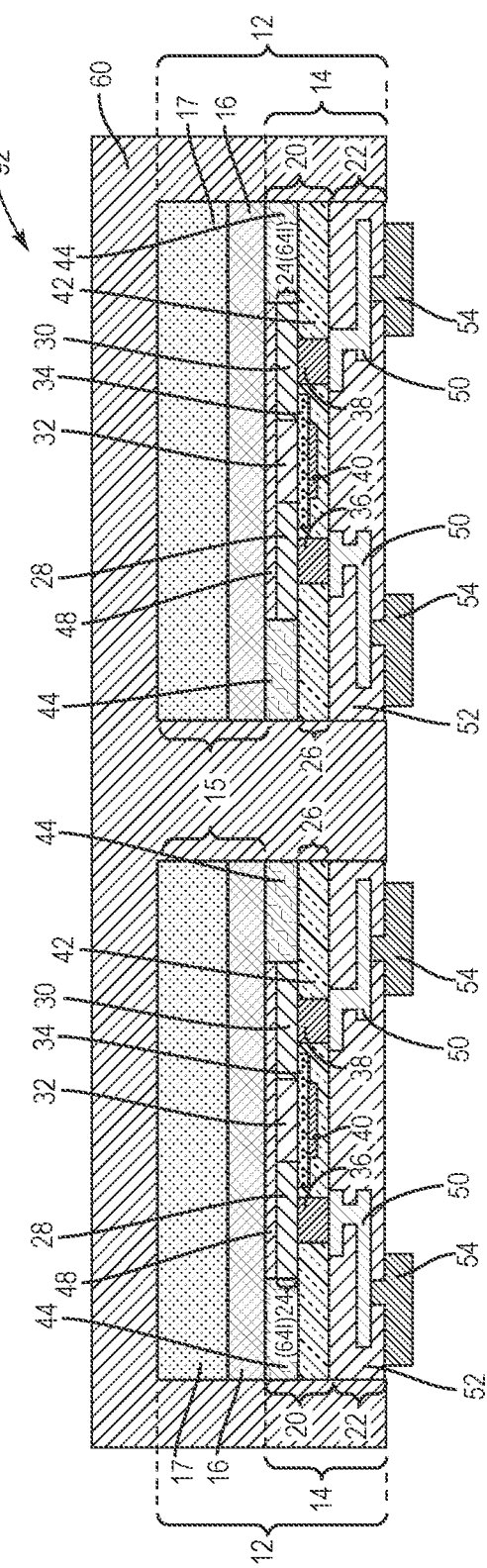

RF DEVICES WITH ENHANCED PERFORMANCE AND METHODS OF FORMING THE SAME

RELATED APPLICATIONS

This application claims the benefit of provisional patent application Ser. No. 62/866,943, filed Jun. 26, 2019, and provisional patent application Ser. No. 62/795,804, filed Jan. 23, 2019, the disclosures of which are hereby incorporated herein by reference in their entireties.

The present application is related to U.S. patent application Ser. No. 16/678,573, filed on Nov. 8, 2019, entitled "RF DEVICES WITH ENHANCED PERFORMANCE AND METHODS OF FORMING THE SAME," U.S. patent application Ser. No. 16/678,586, filed on Nov. 8, 2019, entitled "RF DEVICES WITH ENHANCED PERFORMANCE AND METHODS OF FORMING THE SAME," U.S. patent application Ser. No. 16/678,551, filed on Nov. 8, 2019, entitled "RF DEVICES WITH ENHANCED PERFORMANCE AND METHODS OF FORMING THE SAME," and U.S. patent application Ser. No. 16/678,602, filed on Nov. 8, 2019, entitled "RF DEVICES WITH ENHANCED PERFORMANCE AND METHODS OF FORMING THE SAME," the disclosures of which are hereby incorporated herein by reference in their entireties.

FIELD OF THE DISCLOSURE

The present disclosure relates to a radio frequency (RF) device and a process for making the same, and more particularly to an RF device with enhanced thermal and electrical performance, and a wafer-level fabricating and packaging process to provide the RF device with enhanced performance.

BACKGROUND

The wide utilization of cellular and wireless devices drives the rapid development of radio frequency (RF) technologies. The substrates on which RF devices are fabricated play an important role in achieving high level performance in the RF technologies. Fabrications of the RF devices on conventional silicon substrates may benefit from low cost of silicon materials, a large scale capacity of wafer production, well-established semiconductor design tools, and well-established semiconductor manufacturing techniques. Despite the benefits of using conventional silicon substrates for the RF device fabrications, it is well known in the industry that the conventional silicon substrates may have two undesirable properties for the RF devices: harmonic distortion and low resistivity values. The harmonic distortion is a critical impediment to achieve high level linearity in the RF devices built over silicon substrates.

In addition, high speed and high performance transistors are more densely integrated in RF devices. Consequently, the amount of heat generated by the RF devices will increase significantly due to the large number of transistors integrated in the RF devices, the large amount of power passing through the transistors, and/or the high operation speed of the transistors. Accordingly, it is desirable to package the RF devices in a configuration for better heat dissipation.

Wafer-level fan-out (WLFO) technology and embedded wafer-level ball grid array (eWLB) technology currently attract substantial attention in portable RF applications. WLFO and eWLB technologies are designed to provide high density input/output (I/O) ports without increasing the size of a package. This capability allows for densely packaging the RF devices within a single wafer.

To enhance the operation speed and performance of the RF devices, to accommodate the increased heat generation of the RF devices, to reduce deleterious harmonic distortion of the RF devices, and to utilize advantages of WLFO/eWLB technologies, it is therefore an object of the present disclosure to provide an improved wafer-level fabricating and packaging process for the RF devices with enhanced performance. Further, there is also a need to enhance the performance of the RF devices without increasing the device size.

SUMMARY

The present disclosure relates to a radio frequency (RF) device with enhanced performance, and a process for making the same. The disclosed RF device includes a transfer device die and a multilayer redistribution structure. The transfer device die includes a device region with a front-end-of-line (FEOL) portion and a back-end-of-line (BEOL) portion and a transfer substrate. Herein, the FEOL portion resides over the BEOL portion and includes isolation sections and an active layer, which is surrounded by the isolation sections and does not extend vertically beyond the isolation sections. The device region has a planarized top surface. The transfer substrate, which includes a porous silicon (PSi) region, resides over the top surface of the device region. Herein, the PSi region has a porosity between 1% and 80%. The multilayer redistribution structure, which includes a number of bump structures, is formed underneath the BEOL portion of the transfer device die. The bump structures are on a bottom surface of the multilayer redistribution structure and electrically coupled to the FEOL portion of the transfer device die.

In one embodiment of the RF device, silicon crystal, which has no germanium, nitrogen, or oxygen content, does not exist between the PSi region of the transfer substrate and the active layer within the device region.

In one embodiment of the RF device, the PSi region has a thermal conductivity greater than 2 W/m·K and a resistivity greater than 100 Ohm-cm.

In one embodiment of the RF device, PSi region has a thickness between 20 μm and 1000 μm.

In one embodiment of the RF device, the transfer substrate further includes a silicon handle region residing over the PSi region.

In one embodiment of the RF device, the PSi region has a thickness between 20 μm and 1000 μm, and the silicon handle region has a thickness between 100 Å and 100 μm.

In one embodiment of the RF device, the active layer is formed from a strained silicon epitaxial layer, in which a lattice constant of silicon is greater than 5.461 at a temperature of 300K.

In one embodiment of the RF device, the BEOL portion includes connecting layers, the FEOL portion further includes a contact layer, and the multilayer redistribution structure further includes redistribution interconnections. Herein, the active layer and the isolation sections reside over the contact layer, and the BEOL portion resides underneath the contact layer. The bump structures are electrically coupled to the FEOL portion of the transfer device die via the redistribution interconnections within the multilayer redistribution structure and the connecting layers within the BEOL portion.

In one embodiment of the RF device, the device region further includes a passivation layer over the active layer and surrounded by the isolation sections. Herein, the passivation layer is formed of silicon dioxide. A top surface of each isolation section and a top surface of the passivation layer are coplanar and form the top surface of the device region.

In one embodiment of the RF device, a top surface of each isolation section and a top surface of the active layer are coplanar and form the top surface of the device region.

In one embodiment of the RF device, the transfer device die further includes a barrier layer, which is formed of silicon nitride, coupled between the top surface of the device region and the PSi region of the transfer substrate.

According to another embodiment, an alternative RF device includes a transfer device die and a multilayer redistribution structure. The transfer device die includes a device region with a FEOL portion and a BEOL portion and a transfer substrate. Herein, the FEOL portion resides over the BEOL portion and includes isolation sections and an active layer, which is surrounded by the isolation sections and does not extend vertically beyond the isolation sections. The device region has a planarized top surface. The transfer substrate, which includes a PSi region, resides over the top surface of the device region. The PSi region has a porosity between 1% and 80%. The multilayer redistribution structure, which is formed underneath the BEOL portion of the transfer device die, extends horizontally beyond the transfer device die. The multilayer redistribution structure includes a number of bump structures, which are on a bottom surface of the multilayer redistribution structure and electrically coupled to the FEOL portion of the transfer device die. The alternative RF device further includes a mold compound residing over the multilayer redistribution structure to encapsulate the transfer device die.

In one embodiment of the alternative RF device, silicon crystal, which has no germanium, nitrogen, or oxygen content, does not exist between the PSi region of the transfer substrate and the active layer within the device region.

In one embodiment of the alternative RF device, the PSi region has a thermal conductivity greater than 2 W/m·K and a resistivity greater than 100 Ohm-cm.

In one embodiment of the alternative RF device, the PSi region has a thickness between 20 μm and 1000 μm.

In one embodiment of the alternative RF device, the transfer substrate further includes a silicon handle region residing over the PSi region.

In one embodiment of the alternative RF device, the PSi region has a thickness 20 μm and 1000 μm, and the silicon handle region has a thickness between 100 Å and 100 μm.

In one embodiment of the alternative RF device, the active layer is formed from a strained silicon epitaxial layer, in which a lattice constant of silicon is greater than 5.461 at a temperature of 300K.

In one embodiment of the alternative RF device, the BEOL portion includes connecting layers, the FEOL portion further includes a contact layer, and the multilayer redistribution structure further includes redistribution interconnections. Herein, the active layer and the isolation sections reside over the contact layer, and the BEOL portion resides underneath the contact layer. The bump structures are electrically coupled to the FEOL portion of the transfer device die via the redistribution interconnections within the multilayer redistribution structure and the connecting layers within the BEOL portion.

In one embodiment of the alternative RF device, the device region further includes a passivation layer over the active layer and surrounded by the isolation sections. Herein, the passivation layer is formed of silicon dioxide. A top surface of each isolation section and a top surface of the passivation layer are coplanar and form the top surface of the device region.

In one embodiment of the alternative RF device, a top surface of each isolation section and a top surface of the active layer are coplanar and form the top surface of the device region.

In one embodiment of the alternative RF device, the transfer device die further includes a barrier layer, which is formed of silicon nitride, coupled between the top surface of the device region and the PSi region of the transfer substrate.

According to an exemplary process, a precursor wafer, which includes a number of intact device regions, a number of individual interfacial layers, and a sacrificial silicon handle substrate, is firstly provided. Each intact device region includes a BEOL portion and an intact FEOL portion over the BEOL portion. The intact FEOL portion has an active layer and intact isolation sections, which extend vertically beyond the active layer and surround the active layer. Herein, each individual interfacial layer is over one active layer and surrounded by the intact isolation sections of a corresponding intact device region. Each individual interfacial layer is formed of SiGe. The sacrificial silicon handle substrate is over each intact isolation section and each individual interfacial layer. Next, the sacrificial silicon handle substrate is removed completely. The intact isolation sections are then thinned down to provide a thinned wafer with a planarized top surface. The thinned wafer includes a number of device regions, and a combination of a top surface of each device region forms the planarized top surface of the thinned wafer. Each device region includes the BEOL portion and an FEOL portion over the BEOL portion. The FEOL portion has the active layer and the thinned isolation sections, which surround the active layer. A transfer substrate is attached to the top surface of the thinned wafer to provide a transfer device wafer that includes a number of transfer device dies. Herein, the transfer substrate includes a porous silicon (PSi) region, which has a porosity between 1% and 80%. Each transfer device die includes a corresponding device region and a portion of the PSi region over the corresponding device region.

In one embodiment of the exemplary process, silicon crystal, which has no germanium, nitrogen, or oxygen content, does not exist between the PSi region of the transfer substrate and the active layer within the device region.

In one embodiment of the exemplary process, the PSi region has a thickness between 20 μm and 1000 μm.

In one embodiment of the exemplary process, the transfer substrate further includes a silicon handle region residing over the PSi region. Herein, each of the transfer device dies further includes a portion of the silicon handle region over the portion of the PSi region.

In one embodiment of the exemplary process, the PSi region has a thickness between 20 μm and 1000 μm, and the silicon handle region has a thickness between 100 Å and 100 μm.

According to another embodiment, the exemplary process further includes bonding the precursor wafer to a temporary carrier via a bonding layer before the sacrificial silicon handle substrate is removed, and debonding the temporary carrier and cleaning the bonding layer from the transfer device wafer after the transfer substrate is attached.

According to another embodiment, the exemplary process further includes forming a multilayer redistribution structure underneath the transfer device wafer. Herein, the multilayer redistribution structure includes a number of bump structures on a bottom surface of the multilayer redistribution structure and redistribution interconnections within the multilayer redistribution structure. Each bump structure is electrically coupled to one active layer of a corresponding transfer device die via the redistribution interconnections within the multilayer redistribution structure and connecting layers within the BEOL portion of the corresponding transfer device die.

According to another embodiment, the exemplary process further includes singulating the transfer device wafer into a number of individual transfer device dies. A mold compound is then applied around and over each individual transfer device die to provide a mold device wafer. Herein, the mold compound encapsulates a top surface and side surfaces of each individual transfer device die, while a bottom surface of each individual transfer device die is exposed. A bottom surface of the mold device wafer is a combination of the bottom surface of each individual transfer device die and a bottom surface of the mold compound. Next, a multilayer redistribution structure is formed underneath the mold device wafer. The multilayer redistribution structure includes a number of bump structures on a bottom surface of the multilayer redistribution structure and redistribution interconnections within the multilayer redistribution structure. Each bump structure is electrically coupled to one active layer of a corresponding individual transfer device die via the redistribution interconnections within the multilayer redistribution structure and connecting layers within the BEOL portion of the corresponding individual transfer device die.

According to another embodiment, the exemplary process further includes removing each individual interfacial layer after removing the sacrificial silicon handle substrate and before thinning down the intact isolation sections. As such, after the thinning down step, the planarized top surface of each device region is formed by a top surface of a corresponding active layer and top surfaces of corresponding thinned isolation sections.

According to another embodiment, the exemplary process further includes removing each individual interfacial layer and applying a passivation layer over a corresponding active layer after removing the sacrificial silicon handle substrate and before thinning down the intact isolation sections. As such, after the thinning down step, the planarized top surface of each device region is formed by a top surface of a corresponding passivation layer and top surfaces of corresponding thinned isolation sections.

In one embodiment of the exemplary process, the passivation layer is applied by one of a plasma enhanced deposition process, an anodic oxidation process, and an ozone-based oxidation process.

According to another embodiment, the exemplary process further includes applying a barrier layer over the top surface of the thinned wafer before attaching the transfer substrate to the thinned wafer. Herein, the barrier layer is formed of silicon nitride.

In one embodiment of the exemplary process, providing the precursor wafer begins with providing a starting wafer that includes a common silicon epitaxial layer, a common interfacial layer over the common silicon epitaxial layer, and a sacrificial silicon handle substrate over the common interfacial layer. A complementary metal-oxide-semiconductor (CMOS) process is then performed to provide the precursor wafer. Herein, the intact isolation sections extend through the common silicon epitaxial layer and the common interfacial layer, and extend into the sacrificial silicon handle substrate, such that the common interfacial layer is separated into the individual interfacial layers, and the common silicon epitaxial layer is separated into a number of individual silicon epitaxial layers. Each active layer is formed from a corresponding individual silicon epitaxial layer.

In one embodiment of the exemplary process, the sacrificial silicon handle substrate is removed by a mechanical grinding process followed by an etching process.

In one embodiment of the exemplary process, the sacrificial silicon handle substrate is removed by an etching process with an etchant chemistry, which is at least one of tetramethylammonium hydroxide (TMAH), potassium hydroxide (KOH), sodium hydroxide (NaOH), acetylcholine (ACH), and xenon difluoride ($XeF_2$).

In one embodiment of the exemplary process, the sacrificial silicon handle substrate is removed by a reactive ion etching system with a chlorine-based gas chemistry.

In one embodiment of the exemplary process, the transfer substrate is attached to the top surface of the thinned wafer by one of a group consisting of anodic bonding, plasma bonding, and polymeric adhesive bonding.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 3A-16 show an exemplary wafer-level fabricating and packaging process that illustrates steps to provide the exemplary RF device shown in FIG. 1.

FIGS. 17-22 show an alternative wafer-level fabricating and packaging process that illustrates steps to provide the alternative RF device shown in FIG. 2.

Figure 1:
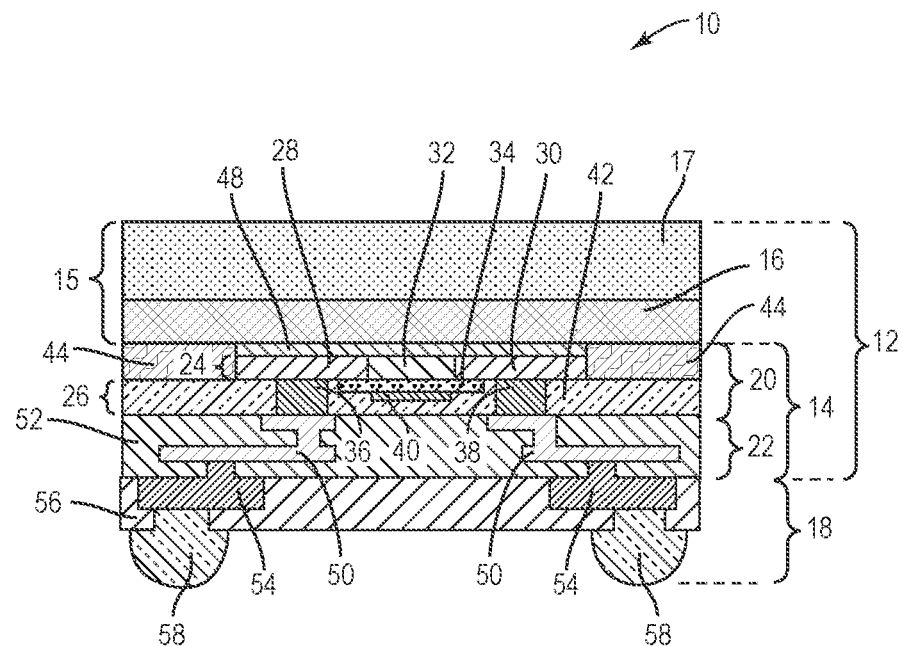
FIG. 1 shows an exemplary radio frequency (RF) device with enhanced performance according to one embodiment of the present disclosure.

It will be understood that for clear illustrations, FIGS. 1-22 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "over" or "under" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

With the looming shortage of conventional radio frequency silicon on insulator (RFSOI) wafers expected in the coming years, alternative technologies are being devised to get around the need for high resistivity using silicon wafers, the trap rich layer formation, and Smart-Cut SOI wafer process. One alternative technology is based on the use of a silicon germanium (SiGe) interfacial layer instead of a buried oxide layer (BOX) between a silicon substrate and a silicon epitaxial layer. However, this technology will still suffer from the deleterious distortion effects due to the silicon substrate, similar to what is observed in an RFSOI technology. The present disclosure, which relates to a radio frequency (RF) device with enhanced performance, and a wafer-level fabricating and packaging process for making the same, utilizes the SiGe interfacial layer without deleterious distortion effects from the silicon substrate.

FIG. 1 shows an exemplary RF device 10 with enhanced performance according to one embodiment of the present disclosure. For the purpose of this illustration, the exemplary RF device 10 includes a transfer device die 12 that has a device region 14 and a transfer substrate 15, and a multilayer redistribution structure 18 formed under the device region 14 of the transfer device die 12.

In detail, the device region 14 includes a front-end-of-line (FEOL) portion 20 and a back-end-of-line (BEOL) portion 22 underneath the FEOL portion 20. In one embodiment, the FEOL portion 20 may be configured to provide a switch field-effect transistor (FET), and includes an active layer 24 and a contact layer 26. The active layer 24 may be formed from a relaxed silicon epitaxial layer or from a strained silicon epitaxial layer, and includes a source 28, a drain 30, and a channel 32 between the source 28 and the drain 30. Herein, a relaxed silicon epitaxial layer refers to a silicon epitaxial layer, in which the lattice constant of silicon is 5.431 at a temperature of 300K. The strained silicon epitaxial layer refers to a silicon epitaxial layer, in which the lattice constant of silicon is greater than the lattice constant in the relaxed silicon epitaxial layer, such as greater than 5.461, or greater than 5.482, or greater than 5.493, or greater than 5.515 at a temperature of 300K. As such, electrons in the strained silicon epitaxial layer may have enhanced mobility compared to the relaxed silicon epitaxial layer. Consequently, a FET formed from the strained silicon epitaxial layer may have a faster switching speed compared to a FET formed from a relaxed silicon epitaxial layer.

The contact layer 26 is formed underneath the active layer 24 and includes a gate structure 34, a source contact 36, a drain contact 38, and a gate contact 40. The gate structure 34 may be formed of silicon oxide, and extends horizontally underneath the channel 32 (i.e., from underneath the source 28 to underneath the drain 30). The source contact 36 is connected to and under the source 28, the drain contact 38 is connected to and under the drain 30, and the gate contact 40 is connected to and under the gate structure 34. An insulating material 42 may be formed around the source contact 36, the drain contact 38, the gate structure 34, and the gate contact 40 to electrically separate the source 28, the drain 30, and the gate structure 34. In different applications, the FEOL portion 20 may have different FET configurations or provide different device components, such as a diode, a capacitor, a resistor, and/or an inductor.

In addition, the FEOL portion 20 also includes isolation sections 44, which reside over the insulating material 42 of the contact layer 26 and surround the active layer 24. The isolation sections 44 are configured to electrically separate the RF device 10, especially the active layer 24, from other devices formed in a common wafer (not shown). The isolation sections 44 may be formed of silicon dioxide, which may be resistant to etching chemistries such as tetramethylammonium hydroxide (TMAH), xenon difluoride ($XeF_2$), potassium hydroxide (KOH), sodium hydroxide (NaOH), or acetylcholine (ACH), and may be resistant to a dry etching system, such as a reactive ion etching (RIE) system with a chlorine based gas chemistry.

In some applications, the device region 14 further includes a passivation layer 48, which may be formed of silicon dioxide, to passivate the active layer 24. The passivation layer 48 is deposited over the top surface of the active layer 24 and surrounded by the isolation sections 44. In one embodiment, a top surface of the passivation layer 48 and top surfaces of the isolation sections 44 are coplanar. The passivation layer 48 is configured to terminate surface bonds of the active layer 24, which may be responsible for unwanted leakage.

In some applications, the device region 14 further includes an interfacial layer and/or a buffer structure (not shown), which are formed of SiGe, over the top surface of the active layer 24 and surrounded by the isolation sections 44 (described in the following paragraphs and not shown herein). If the passivation layer 48, the buffer structure, and the interfacial layer exist, the interfacial layer and the buffer structure are vertically between the active layer 24 and the passivation layer 48. Herein, the top surface of the passivation layer 48 and top surfaces of the isolation sections 44 are coplanar. If the passivation layer 48 is omitted, and the interfacial layer and/or the buffer structure exist, the top surface of the interfacial layer (or the top surface of the buffer structure) and the top surfaces of the isolation sections 44 are coplanar (not shown). If the passivation layer 48, the buffer structure, and the interfacial layer are omitted, the top surface of the active layer 24 and the top surfaces of the isolation sections 44 are coplanar (not shown). Notice that, regardless of the presence of the passivation layer 48, the buffer structure, and/or the interfacial layer, a top surface of the device region 14 (a combination of the top surfaces of the isolation sections 44 and the top surface of the passivation layer 48, a combination of the top surfaces of the isolation sections 44 and the top surface of the interfacial layer, a combination of the top surfaces of the isolation sections 44 and the top surface of the buffer structure, or a combination of the top surfaces of the isolation sections 44 and the top surface of the active layer 24) is always planarized.

The transfer substrate 15, which includes a porous silicon (PSi) region 16 and a silicon handle region 17, resides over the top surface of the device region 14. The PSi region 16 is coupled between the device region 14 and the silicon handle region 17. Herein, the silicon handle region 17 may consist of conventional low cost, low resistivity, and high dielectric constant silicon. The resistivity of the silicon handle region 17 may be between 0.02 Ohm-cm and 50 Ohm-cm. The PSi region 16 is formed of porous silicon that is a form of silicon introducing nano-pores in its microstructure. The resistivity of the PSi region 16 is sensitive to the porosity within the PSi region 16. The resistivity of the PSi region 16 may increase from 4565.8 Ohm-cm to 32133.7 Ohm-cm with the porosity of the PSi region 16 increasing from 31% to 73%. Typically, the resistivity of the PSi region 16 is much higher than the resistivity of silicon handle region 17. In addition, the thermal conductivity of the PSi region 16 is also related to the porosity of the PSi region 16. In one embodiment, the porosity of the PSi region 16 may be between 1% and 80%, with a pore diameter between 1 nm and 10000 nm. The resistivity of the PSi region 16 may be between 100 Ohm-cm and 1E12 Ohm-cm, and the thermal conductivity of the PSi region 16 may be between 2 W/m·K and 120 W/m·K.

A thickness of the PSi region 16 is based on the porosity of the PSi region 16, the required resistance of the transfer substrate 15, and the required thermal performance of the RF device 10. A thickness of the silicon handle region 17 is based on the device layout, the distance from the multilayer redistribution structure 18, as well as the specifics of the package and assembly. The PSi region 16 may have a thickness between 2 μm and 1000 μm, while the silicon handle region 17 may have a thickness between 100 Å and 100 μm. Sometimes the silicon handle region 17 may be omitted.

In some applications, the transfer device die 12 may further include a barrier layer coupled between the top surface of the device region 14 and the PSi region 16 of the transfer substrate 15 (not shown). This barrier layer may be formed of silicon nitride with a thickness between 100 Å and 5000 Å. The barrier layer is configured to provide an excellent barrier to moisture and impurities, which could diffuse into the channel 32 of the active layer 24 and cause reliability concerns in the device. In addition, the barrier layer may be configured to enhance adhesion between the device region 14 and the PSi region 16 of the transfer substrate 15. Notice that, regardless of the presence of the barrier layer, the passivation layer 48, the buffer structure, and/or the interfacial layer, silicon crystal, which has no germanium, nitrogen, or oxygen content, does not exist between the PSi region 16 and the top surface of the active layer 24. Each of the barrier layer, the passivation layer 48, the buffer structure, and the interfacial layer is formed of silicon composite.

The BEOL portion 22 is underneath the FEOL portion 20 and includes multiple connecting layers 50 formed within dielectric layers 52. Some of the connecting layers 50 (for internal connection) are encapsulated by the dielectric layers 52 (not shown), while some of the connecting layers 50 have a bottom portion not covered by the dielectric layers 52. Certain connecting layers 50 are electrically connected to the FEOL portion 20. For the purpose of this illustration, one of the connecting layers 50 is connected to the source contact 36, and another connecting layer 50 is connected to the drain contact 38.

The multilayer redistribution structure 18, which is formed underneath the BEOL portion 22 of the transfer device die 12, includes a number of redistribution interconnections 54, a dielectric pattern 56, and a number of bump structures 58. Herein, each redistribution interconnection 54 is connected to a corresponding connecting layer 50 within the BEOL portion 22 and extends over a bottom surface of the BEOL portion 22. The connections between the redistribution interconnections 54 and the connecting layers 50 are solder-free. The dielectric pattern 56 is formed around and underneath each redistribution interconnection 54. Some of the redistribution interconnections 54 (connect the transfer device die 12 to other device components formed from the same wafer) may be encapsulated by the dielectric pattern 56 (not shown), while some of the redistribution interconnections 54 have a bottom portion exposed through the dielectric pattern 56. Each bump structure 58 is formed at a bottom surface of the multilayer redistribution structure 18 and electrically coupled to a corresponding redistribution interconnection 54 through the dielectric pattern 56. As such, the redistribution interconnections 54 are configured to connect the bump structures 58 to certain ones of the connecting layers 50 in the BEOL portion 22, which are electrically connected to the FEOL portion 20. Consequently, the bump structures 58 are electrically connected to the FEOL portion 20 via corresponding redistribution interconnections 54 and corresponding connecting layers 50. In addition, the bump structures 58 are separate from each other and protrude from the dielectric pattern 56.

In some applications, there may be extra redistribution interconnections (not shown) electrically coupled to the redistribution interconnections 54 through the dielectric pattern 56, and extra dielectric patterns (not shown) formed underneath the dielectric pattern 56, such that a bottom portion of some extra redistribution interconnections may be exposed. Consequently, each bump structure 58 is coupled to a corresponding extra redistribution interconnection through the extra dielectric pattern (not shown). Regardless of the level numbers of the redistribution interconnections and/or the dielectric pattern, the multilayer redistribution structure 18 may be free of glass fiber or glass-free. Herein, the glass fiber refers to individual glass strands twisted to become a larger grouping. These glass strands may then be woven into a fabric. The redistribution interconnections 54 may be formed of copper or other suitable metals. The dielectric pattern 56 may be formed of benzocyclobutene (BCB), polyimide, or other dielectric materials. The bump structures 58 may be solder balls or copper pillars. The multilayer redistribution structure 18 has a thickness between 2 μm and 300 μm.

Figure 2:
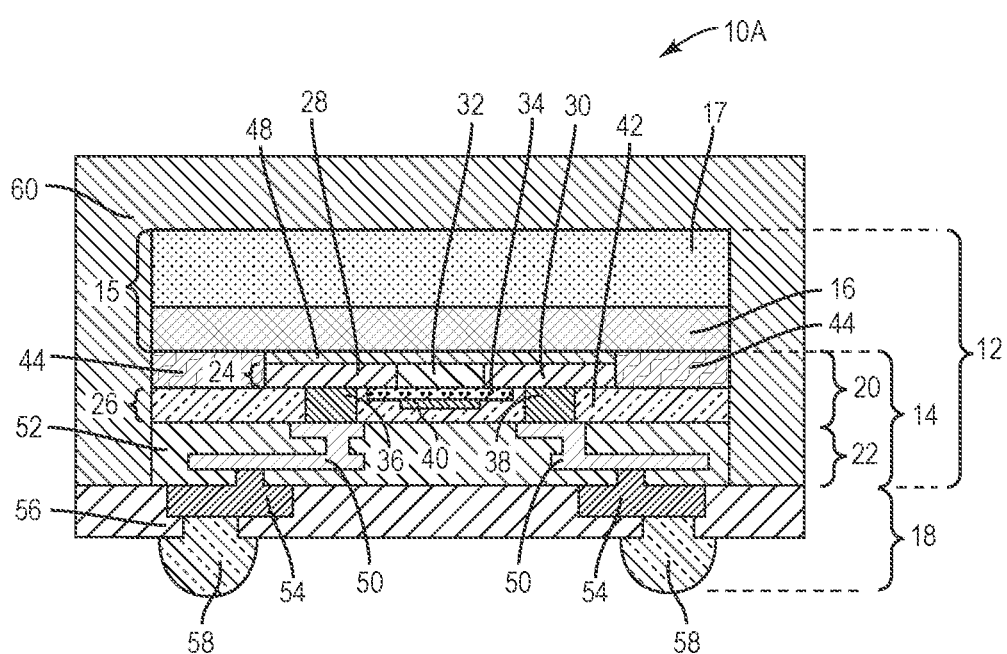
FIG. 2 shows an alternative RF device with enhanced thermal and electrical performance according to one embodiment of the present disclosure.

FIG. 2 shows an alternative RF device 10A, which further includes a mold compound 60 compared to the RF device 10 shown in FIG. 1. Herein, the multilayer redistribution structure 18 may extend horizontally beyond the transfer device die 12, and the mold compound 60 resides over the multilayer redistribution structure 18 to encapsulate the transfer device die 12. In this embodiment, the redistribution interconnections 54 of the multilayer redistribution structure 18 may extend horizontally beyond the transfer device die 12, and the bump structures 58 of the multilayer redistribution structure 18 may not be confined within a periphery of the transfer device die 12. The mold compound 60 may be an organic epoxy resin system or the like.

FIGS. 3A-16 provide an exemplary wafer-level fabricating and packaging process that illustrates steps to fabricate the exemplary RF device 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 3A-16.

Figure 3A:
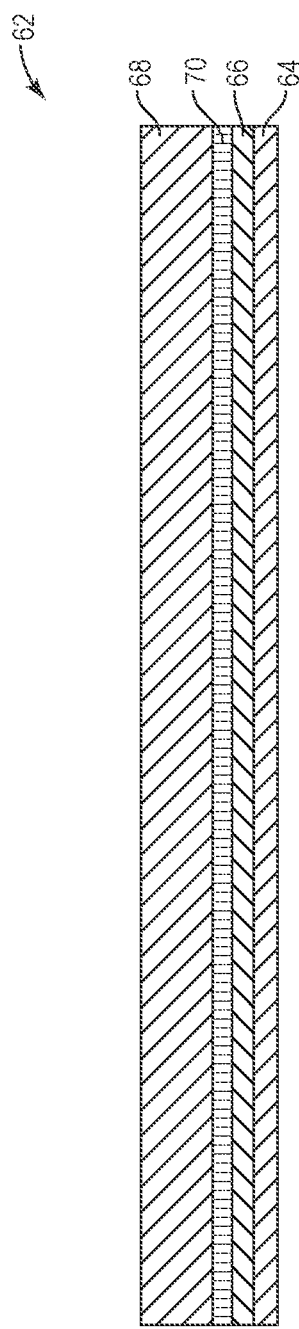
Figure 3B:
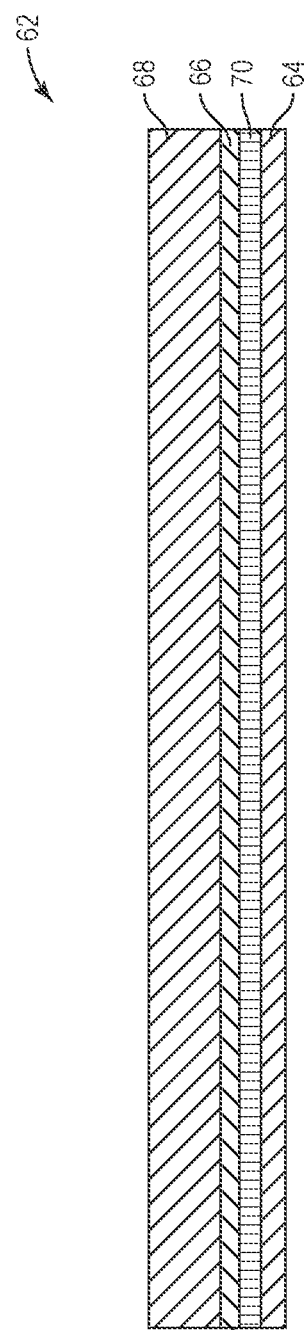

Initially, a starting wafer 62 is provided as illustrated in FIGS. 3A and 3B. The starting wafer 62 includes a common silicon epitaxial layer 64, a common interfacial layer 66 over the common silicon epitaxial layer 64, and a sacrificial silicon handle substrate 68 over the common interfacial layer 66. Herein, the common silicon epitaxial layer 64 is formed from a device grade silicon material, which has desirable silicon epitaxy characteristics to form electronic devices. The sacrificial silicon handle substrate 68 may consist of conventional low cost, low resistivity, and high dielectric constant silicon, which may have a lattice constant about 5.431 at a temperature of 300K. The common interfacial layer 66 is formed of SiGe, which separates the common silicon epitaxial layer 64 from the sacrificial silicon handle substrate 68.

At a fixed temperature, e.g., 300K, a lattice constant of relaxed silicon is 5.431 Å, while a lattice constant of relaxed $Si_{1-x}Ge_x$ depends on the germanium concentration, such as $(5.431+0.2x+0.027x^2)$ Å. The lattice constant of relaxed SiGe is larger than the lattice constant of relaxed silicon. If the common interfacial layer 66 is grown directly under the sacrificial silicon handle substrate 68, the lattice constant in the common interfacial layer 66 will be strained (reduced) by the sacrificial silicon handle substrate 68. If the common silicon epitaxial layer 64 is grown directly under the common interfacial layer 66, the lattice constant in the common silicon epitaxial layer 64 may remain as the original relaxed form (about the same as the lattice constant in the silicon substrate). Consequently, the common silicon epitaxial layer 64 may not enhance electron mobility.

In one embodiment, a common buffer structure 70 may be formed between the sacrificial silicon handle substrate 68 and the common interfacial layer 66, as illustrated in FIG. 3A. The common buffer structure 70 allows lattice constant to transition from the sacrificial silicon handle substrate 68 to the common interfacial layer 66. The common buffer structure 70 may include multiple layers and may be formed of SiGe with a vertically graded germanium concentration. The germanium concentration within the common buffer structure 70 may increase from 0% at a top side (next to the sacrificial silicon handle substrate 68) to X % at a bottom side (next to the common interfacial layer 66). The X % may depend on the germanium concentration within the common interfacial layer 66, such as 15%, or 25%, or 30%, or 40%. The common interfacial layer 66, which herein is grown under the common buffer structure 70, may keep its lattice constant in relaxed form, and may not be strained (reduced) to match the lattice constant of the sacrificial silicon handle substrate 68. The germanium concentration may be uniform throughout the common interfacial layer 66 and greater than 15%, 25%, 30%, or 40%, such that the lattice constant of relaxed SiGe in the common interfacial layer 66 is greater than 5.461, or greater than 5.482, or greater than 5.493, or greater than 5.515 at a temperature of 300K.

Herein, the common silicon epitaxial layer 64 is grown directly under the relaxed common interfacial layer 66, such that the common silicon epitaxial layer 64 has a lattice constant matching (stretching as) the lattice constant in the relaxed common interfacial layer 66. Consequently, the lattice constant in the strained common silicon epitaxial layer 64 may be greater than 5.461, or greater than 5.482, or greater than 5.493, or greater than 5.515 at a temperature of 300K, and therefore greater than the lattice constant in a relaxed silicon epitaxial layer (e.g., 5.431 at a temperature of 300K). The strained common silicon epitaxial layer 64 may have higher electron mobility than a relaxed silicon epitaxial layer. A thickness of the common silicon epitaxial layer 64 may be between 700 nm and 2000 nm, a thickness of the common interfacial layer 66 may be between 200 Å and 600 Å, a thickness of the common buffer structure 70 may be between 100 nm and 1000 nm, and a thickness of the sacrificial silicon handle substrate 68 may be between 200 μm and 700 μm.

In another embodiment, the common interfacial layer 66 may be formed directly under the sacrificial silicon handle substrate 68, and the common buffer structure 70 may be formed between the common interfacial layer 66 and the common silicon epitaxial layer 64, as illustrated in FIG. 3B. Herein, the lattice constant of the common interfacial layer 66 may be strained (reduced) by the sacrificial silicon handle substrate 68. The common buffer structure 70 may still be formed of SiGe with a vertically graded germanium concentration. The germanium concentration within the common buffer structure 70 may increase from 0% at a top side (next to the common interfacial layer 66) to X % at a bottom side (next to the common silicon epitaxial layer 64). The X % may be 15%, or 25%, or 30%, or 40%. The lattice constant at the bottom side of the common buffer structure 70 is greater than a lattice constant at the top side of the common buffer structure 70. The common silicon epitaxial layer 64, which herein is grown under the common buffer structure 70, has a lattice constant matching (stretching as) the lattice constant at the bottom side of the common buffer structure 70. Consequently, the lattice constant in the strained common silicon epitaxial layer 64 is greater than the lattice constant in a relaxed silicon epitaxial layer (e.g., 5.431 at a temperature of 300K).

In some applications, the common buffer structure 70 is omitted (not shown). The common interfacial layer 66 is grown directly under the sacrificial silicon handle substrate 68 and the common silicon epitaxial layer 64 is grown directly under the common interfacial layer 66. As such, the lattice constant in the common interfacial layer 66 is strained (reduced) to match the lattice constant in the sacrificial silicon handle substrate 68, and the lattice constant in the common silicon epitaxial layer 64 remains as the original relaxed form (about the same as the lattice constant in the silicon substrate).

Figure 4:
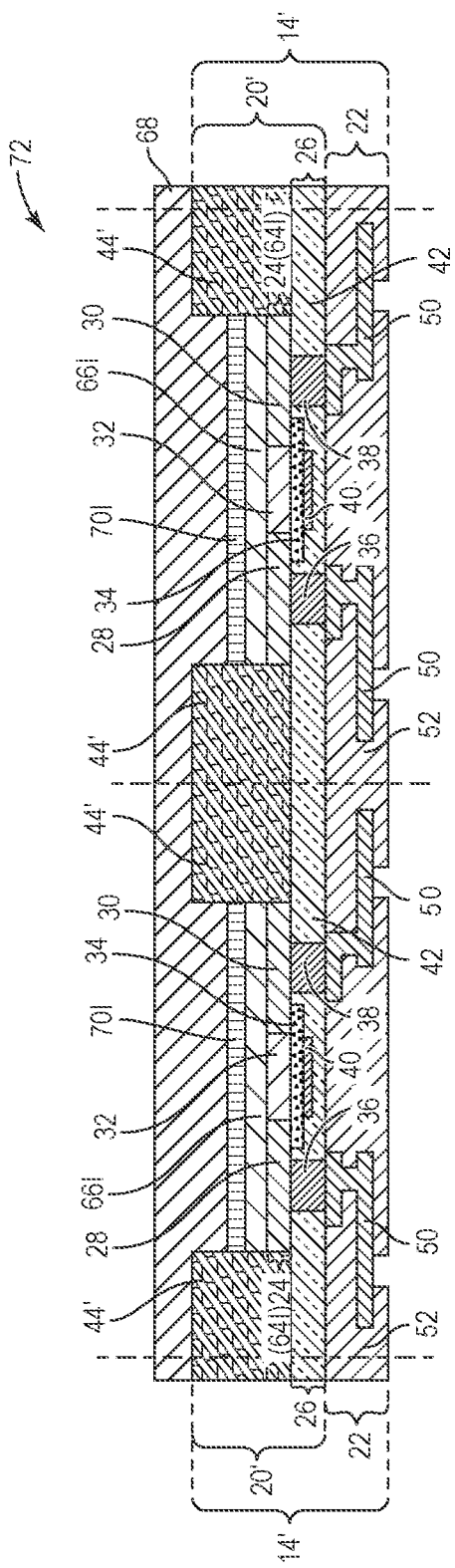

Next, a complementary metal-oxide-semiconductor (CMOS) process is performed on the starting wafer 62 (in FIG. 3A) to provide a precursor wafer 72 with a number of intact device regions 14', as illustrated in FIG. 4. Each intact device region 14' includes an intact FEOL portion 20', which has the active layer 24, the contact layer 26, and intact isolation sections 44', and the BEOL portion 22 underneath the intact FEOL portion 20'. For the purpose of this illustration, the intact FEOL portion 20' is configured to provide a switch FET. In different applications, the intact FEOL portion 20' may have different FET configurations or provide different device components, such as a diode, a capacitor, a resistor, and/or an inductor.

In one embodiment, the intact isolation sections 44' of each intact device region 14' extend through the common silicon epitaxial layer 64, the common interfacial layer 66, and the common buffer structure 70, and extend into the sacrificial silicon handle substrate 68. As such, the common buffer structure 70 is separated into a number of individual buffer structures 70I, the common interfacial layer 66 is separated into a number of individual interfacial layers 66I, and the common silicon epitaxial layer 64 is separated into a number of individual silicon epitaxial layers 64I. Each individual silicon epitaxial layer 64I is used to form a corresponding active layer 24 in one intact device region 14'. The intact isolation sections 44' may be formed by shallow trench isolation (STI). If the active layer 24 is formed from one individual silicon epitaxial layer 64I with strained (increased) lattice constant, the FET based on the active layer 24 may have a faster switching speed (lower ON-resistance) than a FET formed from a relaxed silicon epitaxial layer with relaxed lattice constant.

The top surface of the active layer 24 is in contact with a corresponding interfacial layer 66I, which is underneath a corresponding buffer structure 70I. The sacrificial silicon handle substrate 68 resides over each individual buffer structure 70I, and portions of the sacrificial silicon handle substrate 68 may reside over the intact isolation sections 44'. The BEOL portion 22 of the intact device region 14', which includes at least the multiple connecting layers 50 and the dielectric layers 52, is formed under the contact layer 26 of the intact FEOL portion 20'. Bottom portions of certain connecting layers 50 are exposed through the dielectric layers 52 at the bottom surface of the BEOL portion 22.

Figure 5:
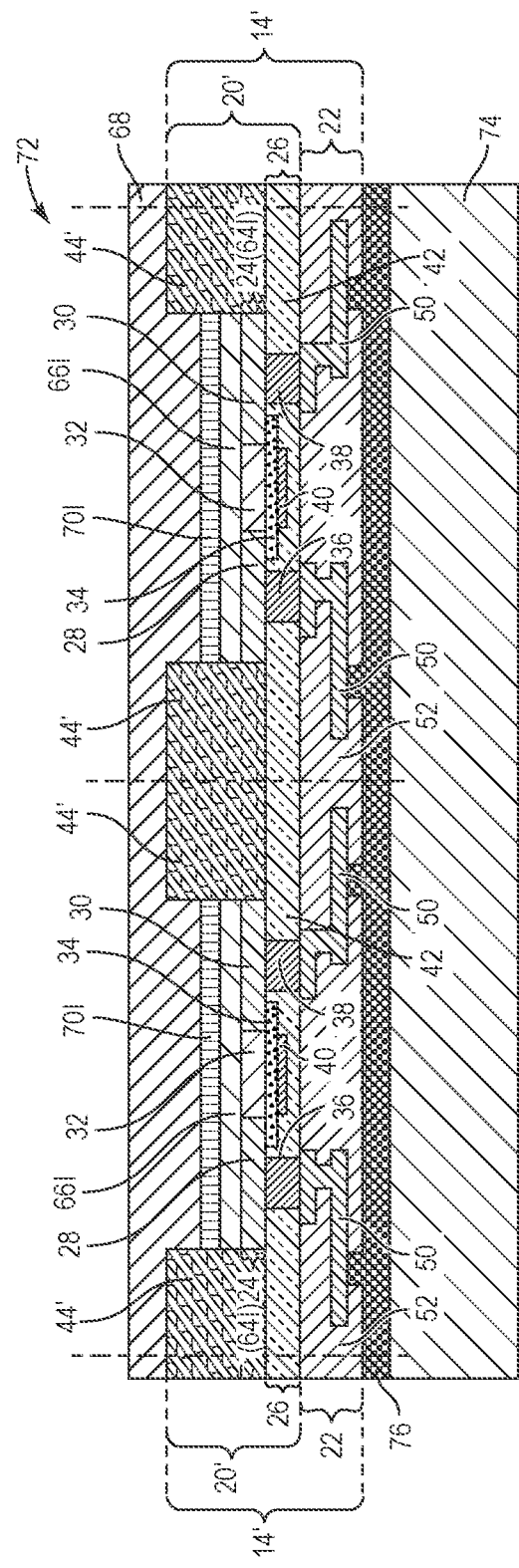

After the precursor wafer 72 is completed, the precursor wafer 72 is then bonded to a temporary carrier 74, as illustrated in FIG. 5. The precursor wafer 72 may be bonded to the temporary carrier 74 via a bonding layer 76, which provides a planarized surface to the temporary carrier 74. The temporary carrier 74 may be a thick silicon wafer from a cost and thermal expansion point of view, but may also be constructed of glass, sapphire, or any other suitable carrier material. The bonding layer 76 may be a span-on polymeric adhesive film, such as the Brewer Science WaferBOND line of temporary adhesive materials.

Figure 6:
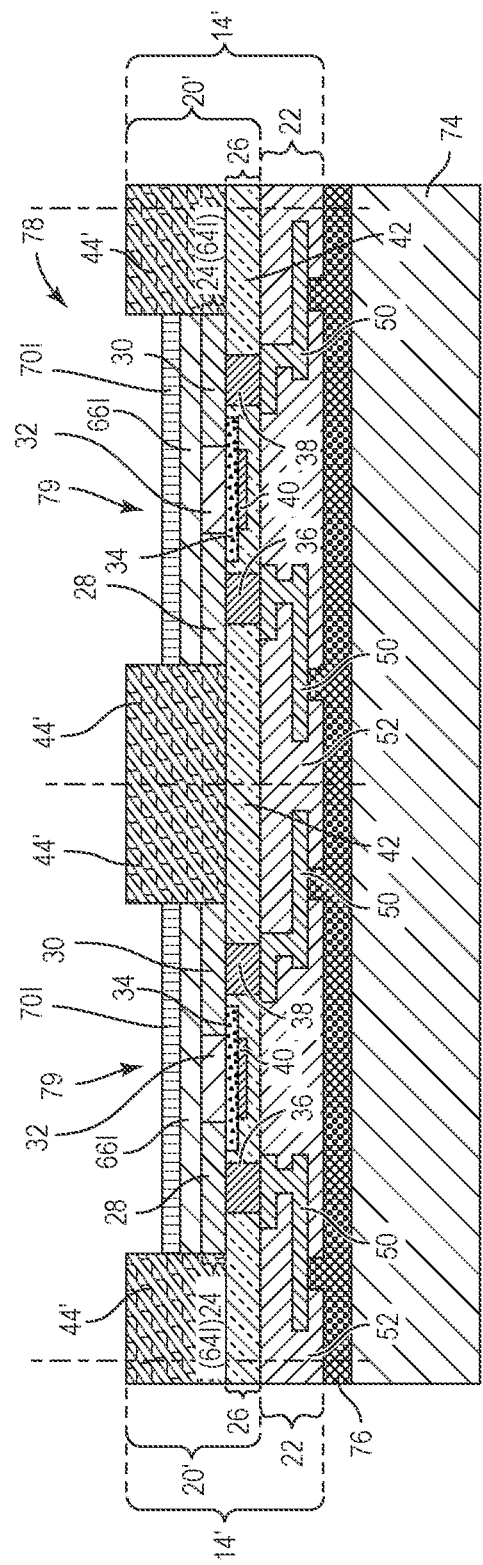

The sacrificial silicon handle substrate 68 is then selectively removed to provide an etched wafer 78, as illustrated in FIG. 6. The selective removal stops at each individual buffer structure 70I or at each interfacial layer 66I. The removal of the sacrificial silicon handle substrate 68 may provide the opening 79 over each active layer 24 and within the intact isolation sections 44'. Removing the sacrificial silicon handle substrate 68 may be provided by a mechanical grinding process and an etching process, or provided by the etching process itself. As an example, the sacrificial silicon handle substrate 68 may be ground to a thinner thickness to reduce the following etching time. An etching process is then performed to at least completely remove the remaining sacrificial silicon handle substrate 68. Since the sacrificial silicon handle substrate 68, the individual buffer structure 70I, and the individual interfacial layer 66I have different germanium concentrations, they may have different reactions to a same etching technique (for instance: different etching speeds with a same etchant). Consequently, the etching system may be capable of identifying the presence of the individual buffer structures 70I or the individual interfacial layers 66I (presence of germanium), and capable of indicating when to stop the etching process. Typically, the higher the germanium concentration, the better the etching selectivity between the sacrificial silicon handle substrate 68 and the individual buffer structures 70I (or between the sacrificial silicon handle substrate 68 and the individual interfacial layers 66I). The etching process may be provided by a wet etching system with an etchant chemistry, which is at least one of TMAH, KOH, NaOH, ACH, and $XeF_2$, or a dry etching system, such as a reactive ion etching system with a chlorine-based gas chemistry.

Figure 7:
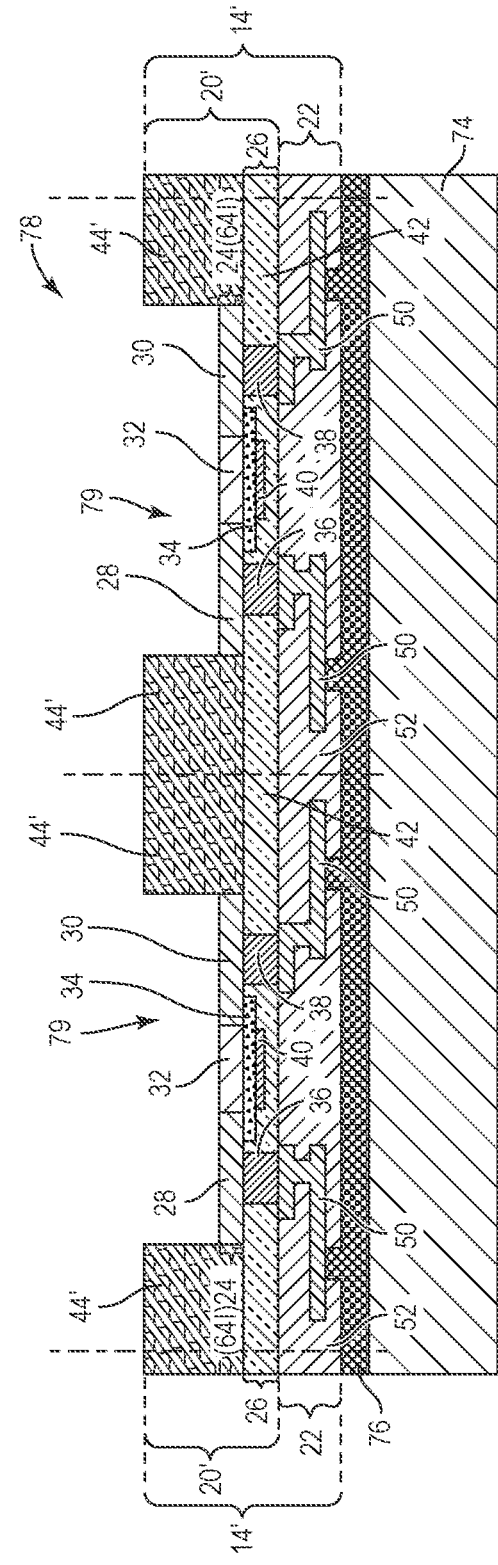

During the removal process, the intact isolation sections 44' are not removed and protect sides of each active layer 24. The bonding layer 76 and the temporary carrier 74 protect the bottom surface of each BEOL portion 22. Herein, a top surface of each intact isolation section 44' and the top surface of each individual buffer structure 70I (or each individual interfacial layer 66I) are exposed after the removal step. Due to the narrow gap nature of the SiGe material, it is possible that the individual buffer structures 70I and/or the individual interfacial layers 66I may be conductive (for some type of devices). The individual buffer structures 70I and/or the individual interfacial layers 66I may cause appreciable leakage between the source 28 and the drain 30 of the active layer 24. Therefore, in some applications, such as FET switch applications, it is desirable to also remove the individual buffer structures 70I and the individual interfacial layers 66I, as illustrated in FIG. 7. Each active layer 24 is exposed at a bottom of a corresponding opening 79. The individual buffer structures 70I and the individual interfacial layers 66I may be removed by the same etching process used to remove the sacrificial silicon handle substrate 68, or may be removed by another etching process, such as a chlorine-based dry etching system. Herein, if each individual interfacial layer 66I is thin enough, it may not cause any appreciable leakage between the source 28 and the drain 30 of the FEOL portion 20. In that case, the individual interfacial layers 66I may be left (not shown). Similarly, if both the individual interfacial layer 66I and the individual buffer structure 70I are thin enough, they may not cause any appreciable leakage between the source 28 and the drain 30 of the FEOL portion 20. Such that, the individual interfacial layers 66I and the individual buffer structures 70I may be left (not shown).

Figure 8:
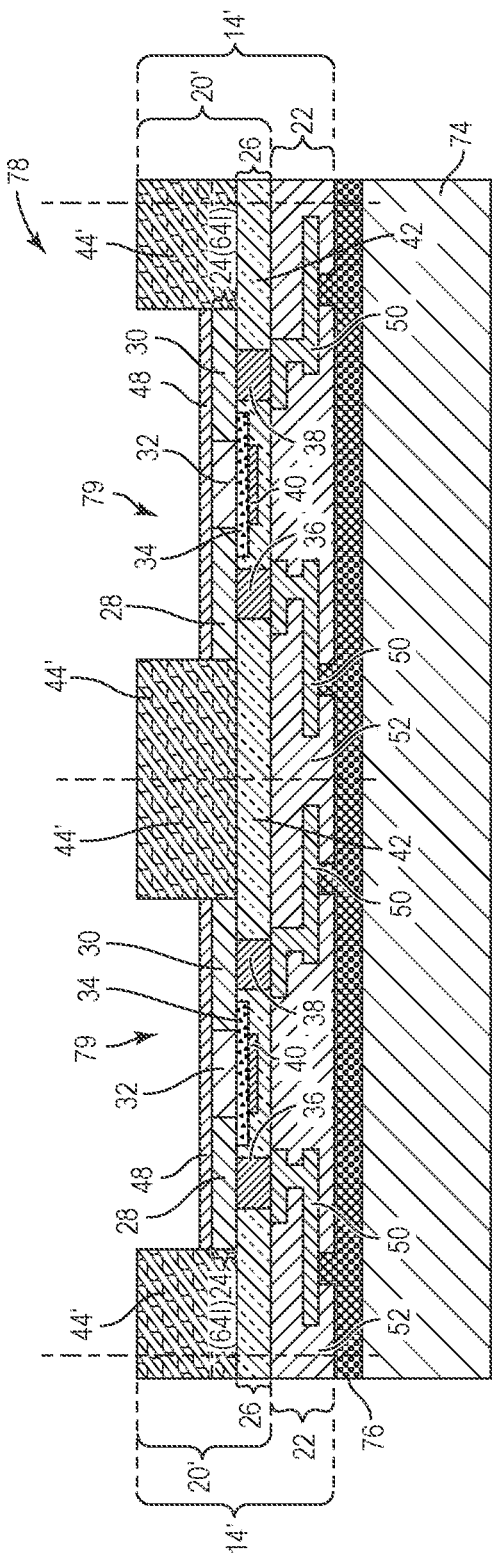

In some applications, after the removal of the sacrificial silicon handle substrate 68, the individual buffer structures 70I, and the individual interfacial layers 66I, each active layer 24 may be passivated to achieve proper low levels of current leakage in the device. The passivation layer 48 may be formed over each active layer 24 and within the opening 79 of each intact FEOL portion 20', as illustrated in FIG. 8. The passivation layer 48 may be formed of silicon dioxide by a plasma enhanced deposition process, an anodic oxidation process, an ozone-based oxidation process, and a number of other proper techniques. The passivation layer 48 is configured to terminate the surface bonds at the top surface of the active layer 24, which may be responsible for unwanted leakage.

Figure 9:
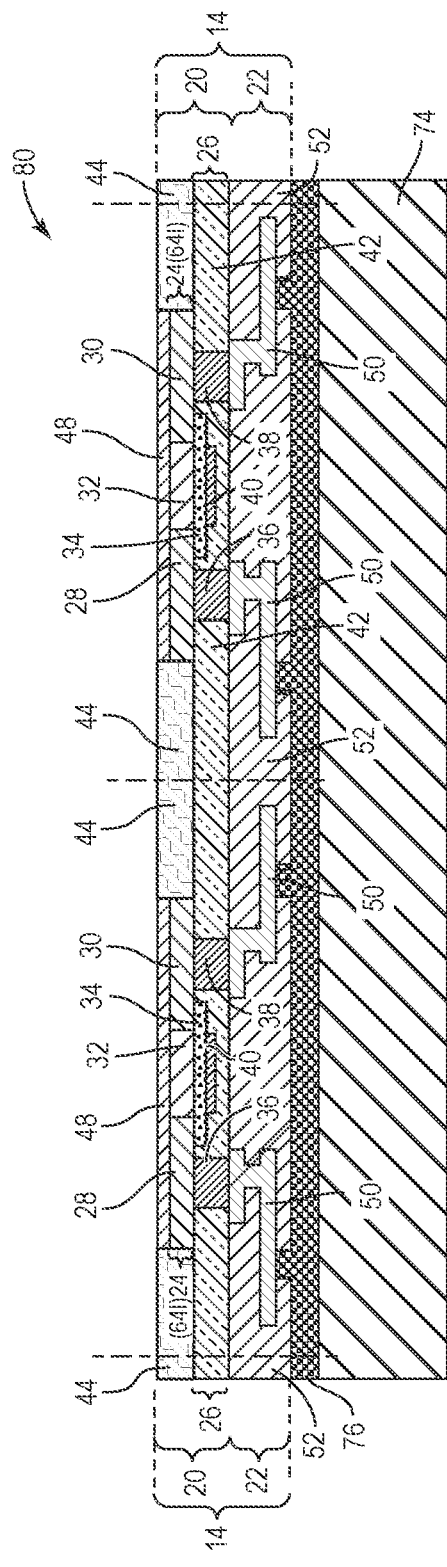

Next, the intact isolation sections 44' are thinned down as the isolation sections 44 to provide a thinned wafer 80 with a planarized top surface, as illustrated in FIG. 9. The thinned wafer 80 includes a number of the device regions 14, and a combination of a top surface of each device region 14 forms the planarized top surface of the thinned wafer 80. Herein, if the passivation layer 48 is applied, the top surface of each passivation layer 48 and the top surface of each isolation section 44 are coplanar. If the passivation layer 48 is omitted, and the individual interfacial layer 66I and/or the individual buffer structure 70I exist, the top surface of each individual interfacial layer 66I (or the top surface of each the individual buffer structure 70I) and the top surface of each isolation section 44 are coplanar (not shown). If the passivation layer 48, the individual buffer structure 70I, and the individual interfacial layer 66I are omitted, the top surface of each active layer 24 and the top surface of each isolation section 44 are coplanar (not shown). Regardless of the presence of the passivation layer 48, the individual buffer structure 70I, and/or the individual interfacial layer 66I, the top surface of each device region 14 is always planarized. The planarization step may be accomplished by a chemical-mechanical polishing (CMP) process with a suitable slurry and polishing wheel, or the like.

Figure 10A:
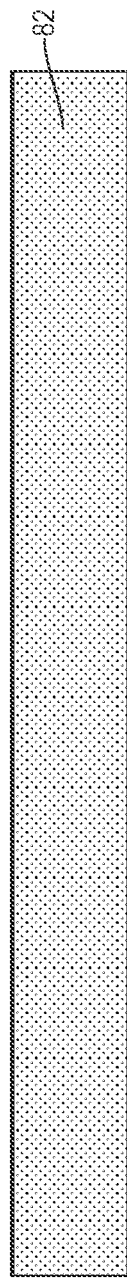
Figure 10B:
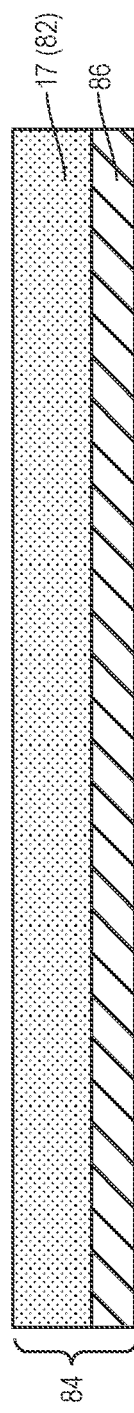
Figure 10C:
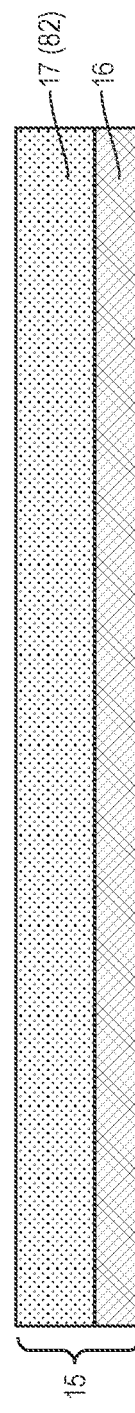

FIGS. 10A and 10C show an exemplary process to fabricate the transfer substrate 15. In FIG. 10A, a precursor silicon handle substrate 82 is provided, which may consist of conventional low cost, low resistivity, and high dielectric constant silicon. The resistivity of the precursor silicon handle substrate 82 may be between 0.02 Ohm-cm and 50 Ohm-cm. Next, a low-dose high-energy ion (such as boron) is implanted into the precursor silicon handle substrate 82 to provide an intermediate substrate 84, as illustrated in FIG. 10B. A lower portion of the precursor silicon handle substrate 82 forms a buried region 86 in the intermediate substrate 84, while an upper portion of the precursor silicon handle substrate 82 remains unchanged as the silicon handle region 17 in the intermediate substrate 84. When the intermediate substrate 84 is annealed in Nitrogen at temperatures between 600° C. and 1200° C., the silicon lattice properties in the buried region 86 are restored. The ions (such as boron) in the buried region 86 are substantially fully activated. An electrochemical etching process is then performed to provide the transfer substrate 15, which includes the PSi region 16 formed from the buried region 86, as illustrated in FIG. 10C. The silicon handle region 17 is unchanged. The electrochemical etching process requires that a bias voltage is applied across the intermediate substrate 84 and the intermediate substrate 84 is immersed in an appropriate wet chemistry. For instance, a bias of 0.4V-1V for a period of several minutes (5 m-15 m) and a chemistry of 4:1 hydrofluoric acid:isopropyl alcohol (HF:IPA) may be used to convert the boron-doped buried region 86 into the high quality p-type PSi portion 16, while leaving the silicon handle region 17 unchanged.

The resistivity of the PSi region 16 is much higher than the resistivity of silicon handle region 17 (upper portion of the precursor silicon handle substrate 82). In one embodiment, the porosity of the PSi region 16 may be between 1% and 80%, with a pore diameter between 1 nm and 10000 nm. The resistivity of the PSi region 16 may be between 100 Ohm-cm and 1E12 Ohm-cm, and the thermal conductivity of the PSi region 16 may be between 2 W/m·K and 120 W/m·K. The PSi region 16 may have a thickness between 20 µm and 1000 µm, while the silicon handle region 17 has a thickness between 100 Å and 100 µm. Sometimes, the precursor silicon handle substrate 82 may completely transfer to the PSi region 16 (not shown).

Figure 11:
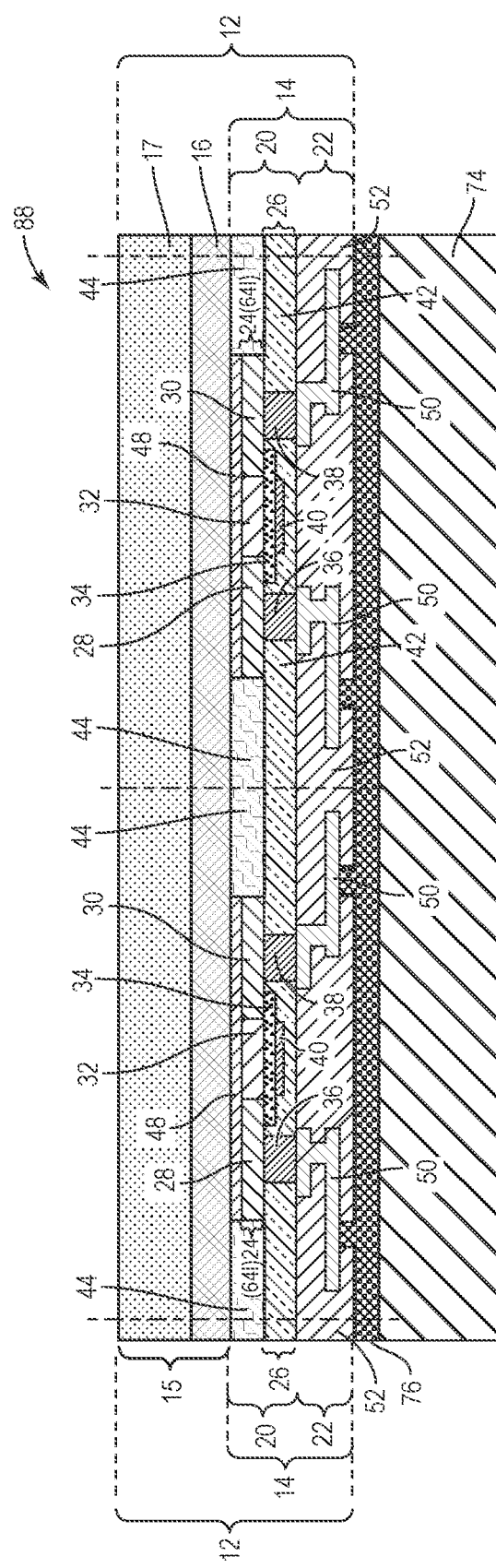

The transfer substrate 15 is then bonded to the top surface of the thinned wafer 80 to provide a transfer device wafer 88, as illustrated in FIG. 11. The PSi region 16 resides over the top surface of the thinned wafer 80, and the silicon handle region 17 resides over the PSi region 16. As such, the PSi region with superior resistivity and thermal conductivity is close to each active layer 24. In addition, since the top surface of the thinned wafer 80 is planarized, the transfer device wafer 88 is devoid of any voids or defects at bonding areas.

The transfer device wafer 88 includes a number of the transfer device dies 12, each of which at least includes the device region 14, a portion of the PSi region 16, and a portion of the silicon handle region 17. A number of suitable low temperature bonding processes may be employed in this step, such as anodic bonding, plasma bonding, polymeric adhesive bonding and the like. During the bonding process of the transfer substrate 15, the temporary carrier 74 provides mechanical strength and rigidity to the thinned wafer 80.

In some applications, there may be a barrier layer formed over the top surface of the thinned wafer 80 before bonding the transfer substrate 15 (not shown). This barrier layer may be formed of silicon nitride with a thickness between 100 Å and 5000 Å. The barrier layer is configured to provide an excellent barrier to moisture and impurities, which could diffuse into the channel 32 of each active layer 24. In addition, the barrier layer may be configured to enhance adhesion between the thinned wafer 80 and the transfer substrate 15. Notice that, regardless of the presence of the barrier layer, the passivation layer 48, or the individual interfacial layer 66I, silicon crystal, which has no germanium, nitrogen, or oxygen content, does not exist between the PSi region 16 and the top surface of each active layer 24. Each of the barrier layer, the passivation layer 48, and the individual interfacial layer 66I is formed of silicon composite.

Figure 12:
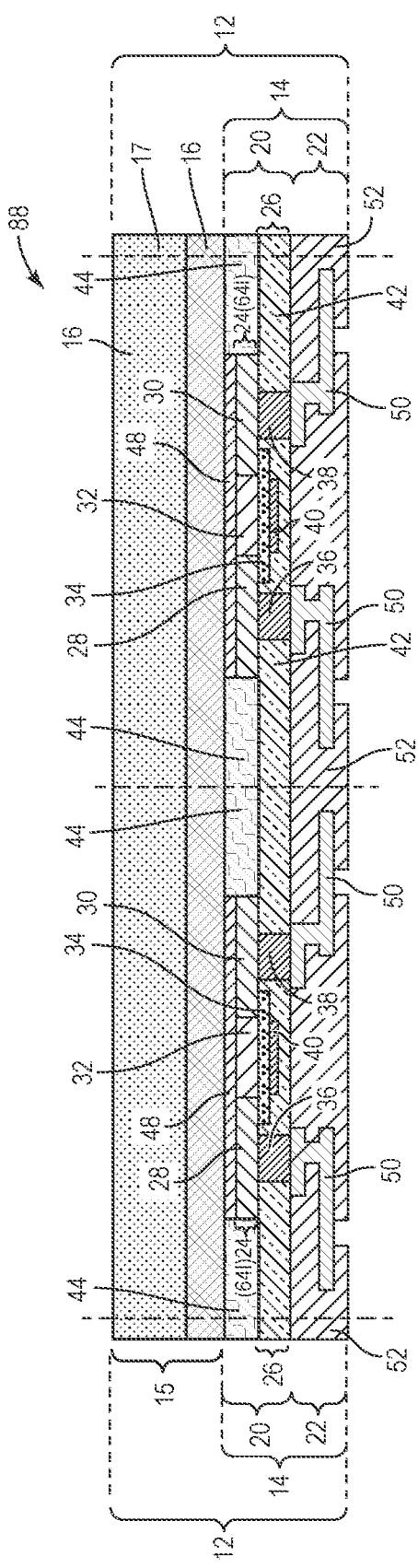

The temporary carrier 74 is then debonded from the transfer device wafer 88, and the bonding layer 76 is cleaned from the transfer device wafer 88, as illustrated in FIG. 12. A number of debonding processes and cleaning processes may be applied depending on the nature of the temporary carrier 74 and the bonding layer 76 chosen in the earlier steps. For instance, the temporary carrier 74 may be mechanically debonded using a lateral blade process with the stack heated to a proper temperature. Other suitable processes involve radiation of UV light through the temporary carrier 74 if it is formed of a transparent material, or chemical debonding using a proper solvent. The bonding layer 76 may be eliminated by wet or dry etching processes, such as proprietary solvents and plasma washing. After the debonding and cleaning process, the bottom portions of certain ones of the connecting layers 50, which may function as input/output (I/O) ports of each transfer device die 12, are exposed through the dielectric layers 52 at the bottom surface of each BEOL portion 22. As such, each transfer device die 12 in the transfer device wafer 88 may be electrically verified to be working properly at this point.

Figure 13:
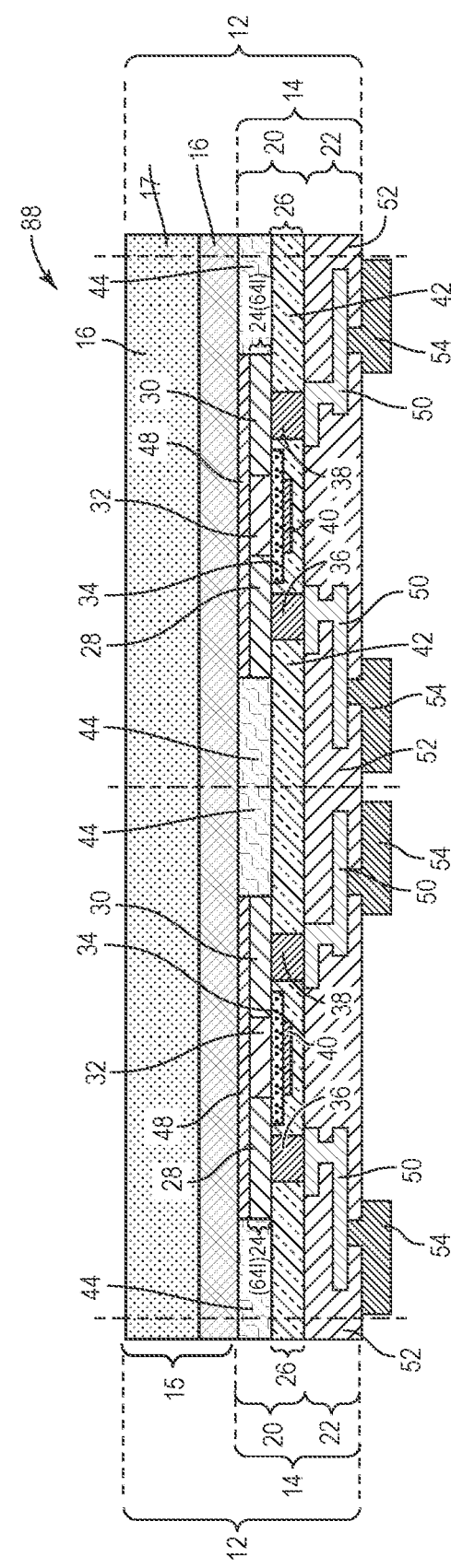
Figures 14, 15:
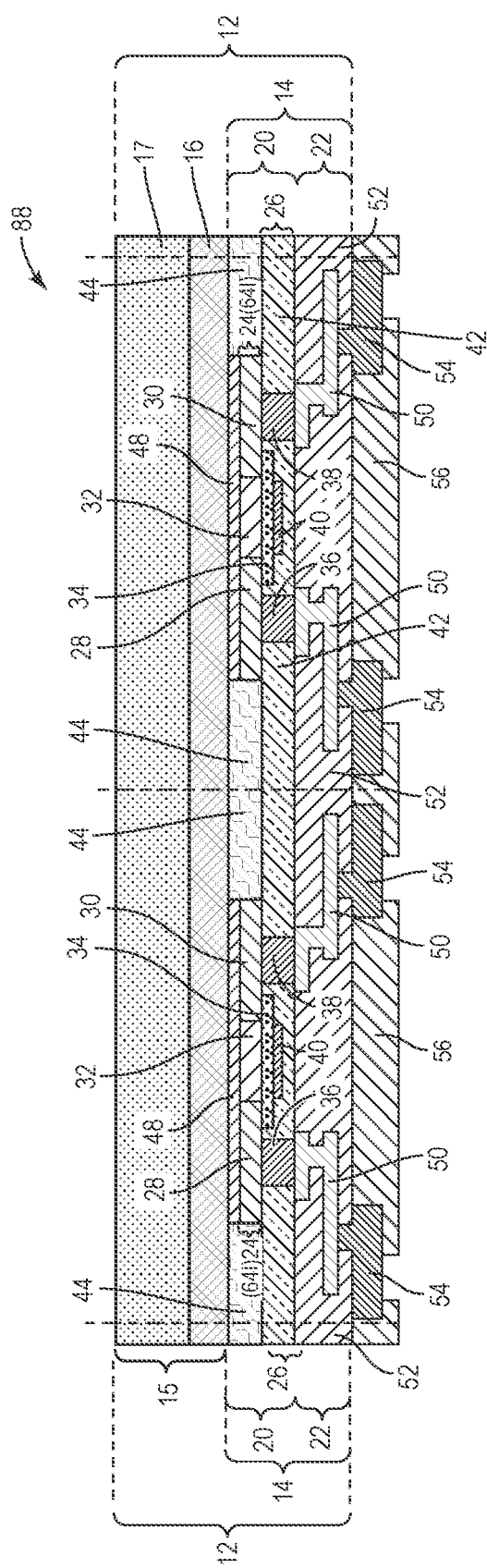

With reference to FIGS. 13 through 15, the multilayer redistribution structure 18 is formed underneath the transfer device wafer 88 according to one embodiment of the present disclosure. Although the redistribution steps are illustrated in a series, the redistribution steps are not necessarily order dependent. Some steps may be done in a different order than that presented. Further, redistribution steps within the scope of this disclosure may include fewer or more steps than those illustrated in FIGS. 13-15.

A number of the redistribution interconnections 54 are firstly formed underneath each BEOL portion 22, as illustrated in FIG. 13. Each redistribution interconnection 54 is electrically coupled to the exposed bottom portion of the corresponding connecting layer 50 within the BEOL portion 22, and may extend over the bottom surface of the BEOL portion 22. The connections between the redistribution interconnections 54 and the connecting layers 50 are solder-free. The dielectric pattern 56 is then formed underneath each BEOL portion 22 to partially encapsulate each redistribution interconnection 54, as illustrated in FIG. 14. As such, the bottom portion of each redistribution interconnection 54 is exposed through the dielectric pattern 56. In different applications, there may be extra redistribution interconnections (not shown) electrically coupled to the redistribution interconnection 54 through the dielectric pattern 56, and extra dielectric patterns (not shown) formed underneath the dielectric pattern 56, such that a bottom portion of each extra redistribution interconnection is exposed.

Next, a number of the bump structures 58 are formed to complete the multilayer redistribution structure 18 and provide a wafer-level fan-out (WLFO) package 90, as illustrated in FIG. 15. Each bump structure 58 is formed at the bottom of the multilayer redistribution structure 18 and electrically coupled to an exposed bottom portion of the corresponding redistribution interconnection 54 through the dielectric pattern 56. Consequently, the redistribution interconnections 54 are configured to connect the bump structures 58 to certain ones of the connecting layer 50 in the BEOL portion 22, which are electrically connected to the FEOL portion 20. As such, the bump structures 58 are electrically connected to the FEOL portion 20 via corresponding redistribution interconnections 54 and corresponding connecting layers 50. In addition, the bump structures 58 are separate from each other and protrude vertically from the dielectric pattern 56.

The multilayer redistribution structure 18 may be free of glass fiber or glass-free. Herein, the glass fiber refers to individual glass strands twisted to become a larger grouping. These glass strands may then be woven into a fabric. The redistribution interconnections 54 may be formed of copper or other suitable metals, the dielectric pattern 56 may be formed of BCB, polyimide, or other dielectric materials, and the bump structures 58 may be solder balls or copper pillars. The multilayer redistribution structure 18 has a thickness between 2 µm and 300 µm. FIG. 16 shows a final step to singulate the WLFO package 90 into individual RF devices 10. The singulating step may be provided by a probing and dicing process at certain isolation sections 44.

In another embodiment, FIGS. 17-22 provide an alternative process that illustrates steps to fabricate the alternative RF device 10A shown in FIG. 2. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 17-22.

After the debonding and cleaning process to provide the clean transfer device wafer 88 as shown in FIG. 12, a singulating step is performed to singulate the transfer device wafer 88 into individual transfer device dies 12, as illustrated in FIG. 17. This singulating step may be provided by a probing and dicing process at certain isolation sections 44. Herein, each transfer device die 12 may have a same height and at least includes the device region 14 with the FEOL portion 20 and the BEOL portion 22 and the transfer substrate 15.

Next, the mold compound 60 is applied around and over the transfer device dies 12 to provide a mold device wafer 92, as illustrated in FIG. 18. The mold compound 60 encapsulates a top surface and side surfaces of each transfer device die 12, while a bottom surface of each transfer device die 12, which is the bottom surface of the BEOL portion 22, is exposed. A bottom surface of the mold device wafer 92 is a combination of the bottom surface of each transfer device die 12 and a bottom surface of the mold compound 60. Herein, the bottom portions of certain ones of the connecting layers 50 remain exposed at the bottom surface of each transfer device die 12. The mold compound 60 may be applied by various procedures, such as sheet molding, overmolding, compression molding, transfer molding, dam fill encapsulation, or screen print encapsulation. Unlike the transfer substrate 15, the mold compound 60 does not have thermal conductivity or electrical resistivity requirements. The mold compound 60 may be an organic epoxy resin system or the like. A curing process (not shown) is then used to harden the mold compound 60. The curing temperature is between 100° C. and 320° C. depending on which material is used as the mold compound 60. A grinding process (not shown) may be performed to provide a planarized top surface of the mold compound 60.

Figure 20:
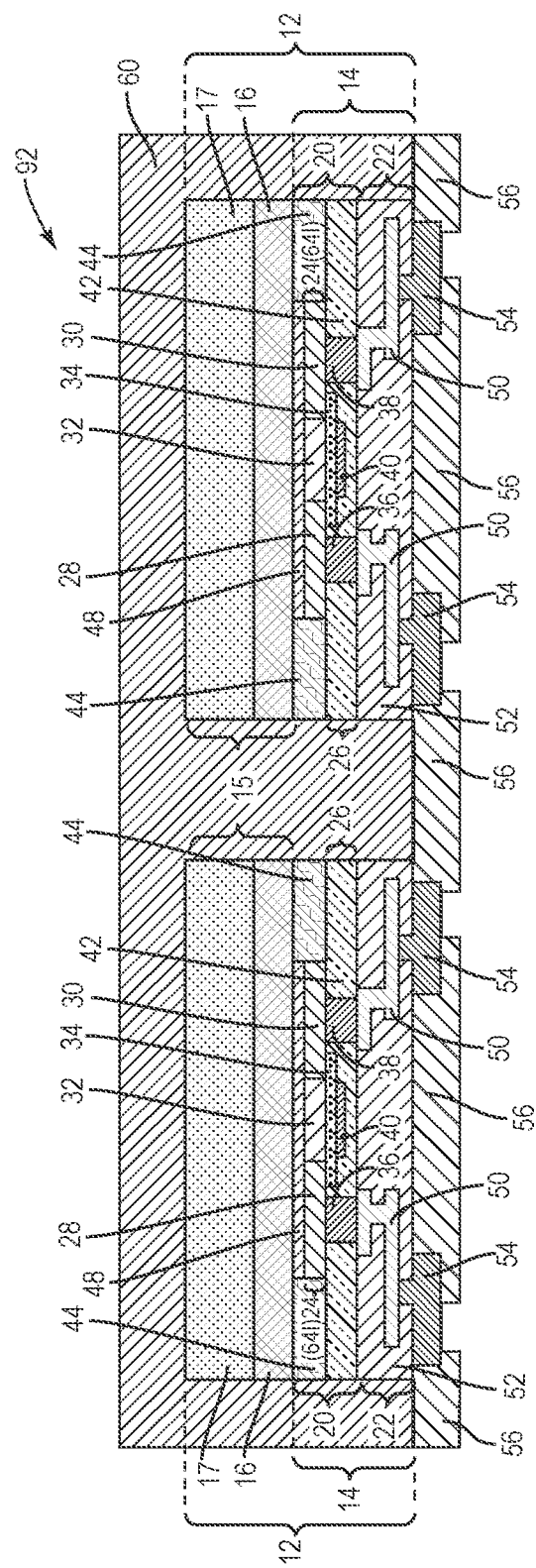
Figure 21:
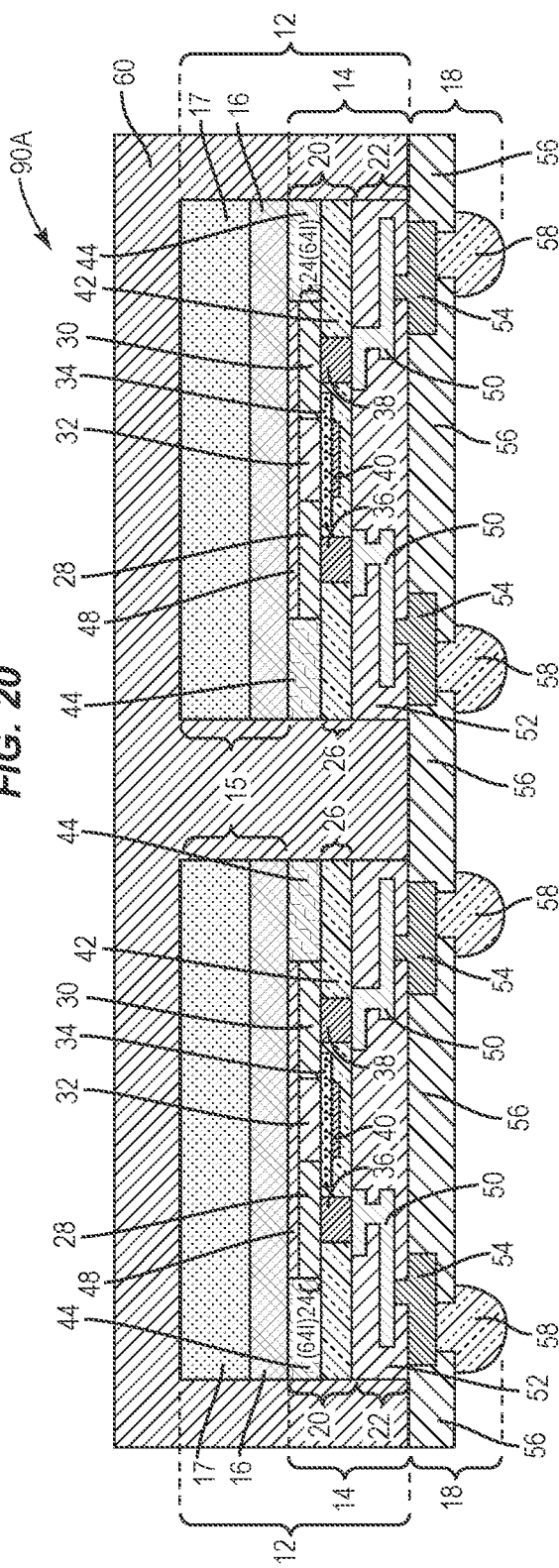

With reference to FIGS. 19 through 21, the multilayer redistribution structure 18 is formed according to one embodiment of the present disclosure. Although the redistribution steps are illustrated in a series, the redistribution steps are not necessarily order dependent. Some steps may be done in a different order than that presented. Further, redistribution steps within the scope of this disclosure may include fewer or more steps than those illustrated in FIGS. 19-21.

A number of the redistribution interconnections 54 are firstly formed underneath the mold device wafer 92, as illustrated in FIG. 19. Each redistribution interconnection 54 is electrically coupled to the corresponding connecting layer 50 within the BEOL portion 22, and may extend horizontally beyond the corresponding transfer device die 12 and underneath the mold compound 60. The connections between the redistribution interconnections 54 and the connecting layers 50 are solder-free. The dielectric pattern 56 is then formed underneath the mold device wafer 92 to partially encapsulate each redistribution interconnection 54, as illustrated in FIG. 20. As such, the bottom portion of each redistribution interconnection 54 is exposed through the dielectric pattern 56. In different applications, there may be extra redistribution interconnections (not shown) electrically coupled to the redistribution interconnection 54 through the dielectric pattern 56, and extra dielectric patterns (not shown) formed underneath the dielectric pattern 56, such that a bottom portion of each extra redistribution interconnection is exposed.

Next, a number of the bump structures 58 are formed to complete the multilayer redistribution structure 18 and provide an alternative WLFO package 90A, as illustrated in FIG. 21. Each bump structure 58 is formed at the bottom of the multilayer redistribution structure 18 and electrically coupled to an exposed bottom portion of the corresponding redistribution interconnection 54 through the dielectric pattern 56. Consequently, the redistribution interconnections 54 are configured to connect the bump structures 58 to certain ones of the connecting layers 50 in the BEOL portion 22, which are electrically connected to the FEOL portion 20. As such, the bump structures 58 are electrically connected to the FEOL portion 20 via corresponding redistribution interconnections 54 and corresponding connecting layers 50. Herein, the bump structures 58 may not be confined within a periphery of a corresponding transfer device die 12. In addition, the bump structures 58 are separate from each other and protrude vertically from the dielectric pattern 56.

Figure 22:
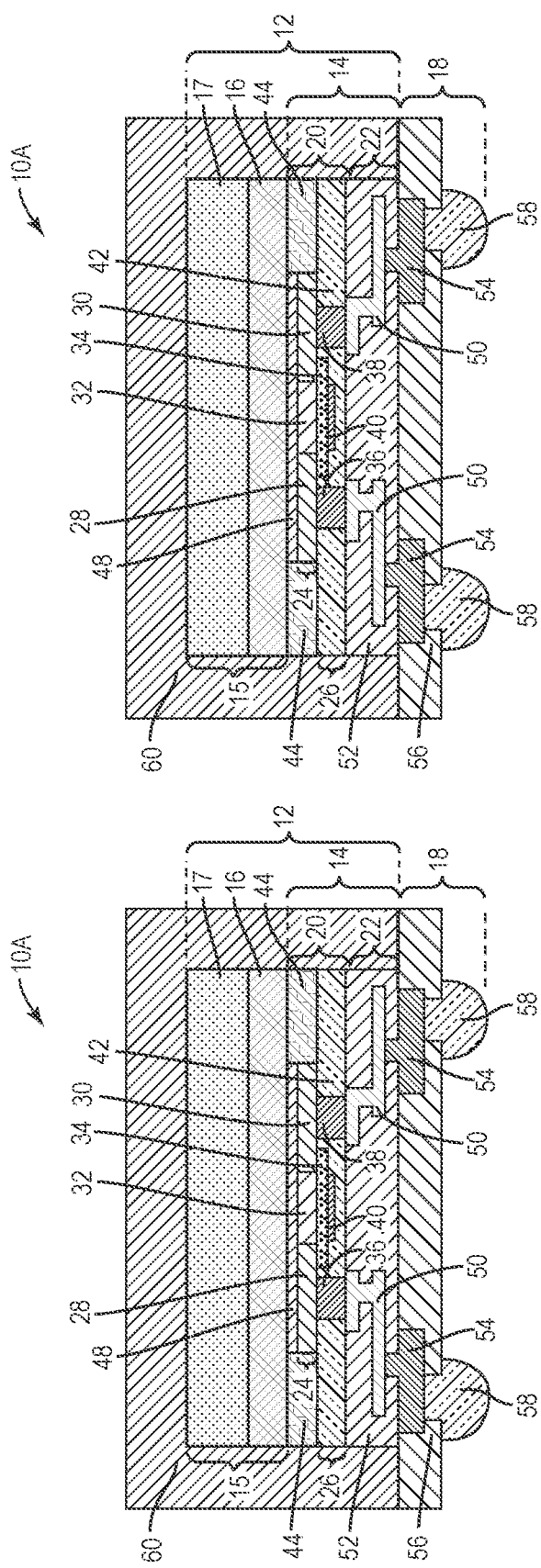

FIG. 22 shows a final step to singulate the alternative WLFO package 90A into individual alternative RF devices 10A. The singulating step may be provided by a probing and dicing process at portions of the mold compound 60, which are horizontally between adjacent transfer device dies 12.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a transfer device die comprising a device region and a transfer substrate, wherein:
the device region includes a front-end-of-line (FEOL) portion and a back-end-of-line (BEOL) portion underneath the FEOL portion, wherein the FEOL portion comprises isolation sections and an active layer, which is surrounded by the isolation sections and does not extend vertically beyond the isolation sections;
a top surface of the device region is planarized; and
the transfer substrate comprising a porous silicon (PSi) region resides over the top surface of the device region, wherein the PSi region has a porosity between 1% and 80%; and
a multilayer redistribution structure formed underneath the BEOL portion of the transfer device die, wherein the multilayer redistribution structure comprises a plurality of bump structures, which are on a bottom surface of the multilayer redistribution structure and electrically coupled to the FEOL portion of the transfer device die.

2. The apparatus of claim 1 wherein silicon crystal, which has no germanium, nitrogen, or oxygen content, does not exist between the PSi region of the transfer substrate and the active layer within the device region.

3. The apparatus of claim 1 wherein the PSi region has a thermal conductivity greater than 2 W/m·K and a resistivity greater than 100 Ohm-cm.

4. The apparatus of claim 1 wherein the PSi region has a thickness between 20 μm and 1000 μm.

5. The apparatus of claim 1 wherein the transfer substrate further comprises a silicon handle region residing over the PSi region.

6. The apparatus of claim 5 wherein the PSi region has a thickness between 20 μm and 1000 μm, and the silicon handle region has a thickness between 100 Å and 100 μm.

7. The apparatus of claim 1 wherein the active layer is formed from a strained silicon epitaxial layer, in which a lattice constant of silicon is greater than 5.461 at a temperature of 300K.

8. The apparatus of claim 1 wherein:
the BEOL portion comprises connecting layers;
the FEOL portion further comprises a contact layer, wherein the active layer and the isolation sections reside over the contact layer, and the BEOL portion resides underneath the contact layer; and
the multilayer redistribution structure further comprises redistribution interconnections, wherein the plurality of bump structures are electrically coupled to the FEOL portion of the transfer device die via the redistribution interconnections within the multilayer redistribution structure and the connecting layers within the BEOL portion.

9. The apparatus of claim 1 wherein the device region further includes a passivation layer over the active layer and surrounded by the isolation sections, wherein:
the passivation layer is formed of silicon dioxide; and
a top surface of each isolation section and a top surface of the passivation layer are coplanar and form the top surface of the device region.

10. The apparatus of claim 1 wherein a top surface of each isolation section and a top surface of the active layer are coplanar and form the top surface of the device region.

11. The apparatus of claim 1 wherein the transfer device die further comprises a barrier layer, which is formed of silicon nitride, coupled between the top surface of the device region and the PSi region of the transfer substrate.

12. An apparatus comprising:
a transfer device die comprising a device region and a transfer substrate, wherein:
the device region includes a front-end-of-line (FEOL) portion and a back-end-of-line (BEOL) portion underneath the FEOL portion, wherein the FEOL portion comprises isolation sections and an active layer, which is surrounded by the isolation sections and does not extend vertically beyond the isolation sections;
a top surface of the device region is planarized; and
the transfer substrate comprising a PSi region resides over the top surface of the device region, wherein the PSi region has a porosity between 1% and 80%;
a multilayer redistribution structure formed underneath the BEOL portion of the transfer device die, wherein:
the multilayer redistribution structure extends horizontally beyond the transfer device die; and
the multilayer redistribution structure comprises a plurality of bump structures, which are on a bottom surface of the multilayer redistribution structure and electrically coupled to the FEOL portion of the transfer device die; and
a mold compound residing over the multilayer redistribution structure to encapsulate the transfer device die.

13. The apparatus of claim 12 wherein silicon crystal, which has no germanium, nitrogen, or oxygen content, does not exist between the PSi region of the transfer substrate and the active layer within the device region.

14. The apparatus of claim 12 wherein the PSi region has a thermal conductivity greater than 2 W/m·K and a resistivity greater than 100 Ohm-cm.

15. The apparatus of claim 12 wherein the PSi region has a thickness between 20 μm and 1000 μm.

16. The apparatus of claim 12 wherein the transfer substrate further comprises a silicon handle region residing over the PSi region.

17. The apparatus of claim 16 wherein the PSi region has a thickness between 20 μm and 1000 μm, and the silicon handle region has a thickness between 100 Å and 100 μm.

18. The apparatus of claim 12 wherein the active layer is formed from a strained silicon epitaxial layer, in which a lattice constant of silicon is greater than 5.461 at a temperature of 300K.

19. The apparatus of claim 12 wherein:
   the BEOL portion comprises connecting layers;
   the FEOL portion further comprises a contact layer, wherein the active layer and the isolation sections reside over the contact layer, and the BEOL portion resides underneath the contact layer; and
   the multilayer redistribution structure further comprises redistribution interconnections, wherein the plurality of bump structures are electrically coupled to the FEOL portion of the transfer device die via the redistribution interconnections within the multilayer redistribution structure and the connecting layers within the BEOL portion.

20. The apparatus of claim 12 wherein the device region further includes a passivation layer over the active layer and surrounded by the isolation sections, wherein:
   the passivation layer is formed of silicon dioxide; and
   a top surface of each isolation section and a top surface of the passivation layer are coplanar, and form the top surface of the device region.

21. The apparatus of claim 12 wherein a top surface of each isolation section and a top surface of the active layer are coplanar, and form the top surface of the device region.

22. The apparatus of claim 12 wherein the transfer device die further comprises a barrier layer, which is formed of silicon nitride, coupled between the top surface of the device region and the PSi region of the transfer substrate.

* * * * *